(12) United States Patent
Kim

(10) Patent No.: US 9,831,455 B2
(45) Date of Patent: *Nov. 28, 2017

(54) LIGHT-EMITTING DISPLAY DEVICE

(71) Applicant: SAMSUNG DISPLAY CO., LTD., Yongin-si, Gyeonggi-do (KR)

(72) Inventor: Geun Tak Kim, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/385,521

(22) Filed: Dec. 20, 2016

(65) Prior Publication Data

US 2017/0104173 A1    Apr. 13, 2017

Related U.S. Application Data

(63) Continuation of application No. 14/597,611, filed on Jan. 15, 2015, now Pat. No. 9,530,827.

(30) Foreign Application Priority Data

Aug. 22, 2014  (KR) .................. 10-2014-0109588

(51) Int. Cl.
*H01L 51/50* (2006.01)
*H01L 27/32* (2006.01)
(Continued)

(52) U.S. Cl.
CPC ...... *H01L 51/5008* (2013.01); *H01L 27/3246* (2013.01); *H01L 51/0004* (2013.01);
(Continued)

(58) Field of Classification Search
CPC ............ H01L 27/3246; H01L 27/3218; H01L 27/3262; H01L 51/0005; H01L 51/5056;
(Continued)

(56) References Cited

U.S. PATENT DOCUMENTS 7,956,535 B2   6/2011 Yanagihara
9,018,833 B2   4/2015 Lowenthal et al.
(Continued)

FOREIGN PATENT DOCUMENTS

KR   10-2014-0037393 A   3/2014
KR   10-2014-0038827 A   3/2014
KR   10-2014-0041119 A   4/2014

OTHER PUBLICATIONS

Yu, Dong In, et al., "Apparent Contact Angle on the Hydrophilic/Hydrophobic Surfaces With Micro-Pillars", J. Korean Soc. Precise Eng., vol. 31, No. 2, pp. 171-178, Feb. 2014.
(Continued)

*Primary Examiner* — Fernando L Toledo
*Assistant Examiner* — Neil Prasad
(74) *Attorney, Agent, or Firm* — Lee & Morse, P.C.

(57) ABSTRACT

A light-emitting display device includes a substrate having a plurality of pixels. A first electrode is provided on the substrate for each pixel, and a pixel defining layer defines each of the pixels. The pixel defining layer has an opening to expose the first electrode. A charge injection layer is on the first electrode, and a surface processing layer is on the charge injection layer. The surface processing layer extends from inside the opening of the pixel defining layer to a top surface of the pixel defining layer. The surface processing layer including a plurality of grooves in a portion extending on the top surface of the pixel defining layer. A charge transport layer is on the surface processing layer, a light-emitting layer is on the charge transport layer, and a second electrode is on the light-emitting layer.

13 Claims, 23 Drawing Sheets

(51) Int. Cl.
  *H01L 51/52* (2006.01)
  *H01L 51/56* (2006.01)
  *H01L 51/00* (2006.01)

(52) U.S. Cl.
  CPC ...... *H01L 51/0005* (2013.01); *H01L 51/5012* (2013.01); *H01L 51/5056* (2013.01); *H01L 51/5088* (2013.01); *H01L 51/5206* (2013.01); *H01L 51/5221* (2013.01); *H01L 51/56* (2013.01)

(58) Field of Classification Search
  CPC ............. H01L 51/5072; H01L 51/5088; H01L 51/5092; H01L 51/56
  See application file for complete search history.

(56) References Cited

U.S. PATENT DOCUMENTS

| | | |
|---|---|---|
| 9,048,449 B2 | 6/2015 | Kim et al. |
| 2012/0007067 A1 | 1/2012 | Kaneta et al. |
| 2013/0026415 A1 | 1/2013 | James et al. |
| 2014/0070175 A1 | 3/2014 | Kang |
| 2014/0097414 A1 | 4/2014 | Kim et al. |
| 2014/0131684 A1 | 5/2014 | Prakash et al. |
| 2014/0217372 A1 | 8/2014 | Shim et al. |

OTHER PUBLICATIONS

European Search Report dated Jan. 25, 2016.

LIGHT-EMITTING DISPLAY DEVICE

CROSS-REFERENCE TO RELATED APPLICATIONS

This is a continuation application based on pending application Ser. No. 14/597,611, filed Jan. 15, 2015, the entire contents of which is hereby incorporated by reference.

Korean Patent Application No. 10-2014-0109588, filed on Aug. 22, 2014, and entitled: "Light-Emitting Display Device and Method of Manufacturing the Same," is incorporated by reference herein in its entirety.

BACKGROUND

1. Field

One or more embodiments described herein relate to a light-emitting display device, and a method of manufacturing a light-emitting display device.

2. Description of the Related Art

An organic light-emitting display is self-luminous and has a wide viewing angle, high contrast ratio, and fast response time. Each pixel of this display has an organic light-emitting layer between an anode electrode and cathode electrode.

When positive and negative voltages are applied to these electrodes, holes move from the anode electrode to the organic light-emitting layer via a hole injection layer and a hole transport layer, and electrons move from the cathode electrode to the organic light-emitting layer via an electron injection layer and an electron transport layer. The electrons and holes recombine in the organic light-emitting layer to generate excitons. As the excitons change from an excited state to a ground state, the organic light-emitting layer emits light to form an image.

The organic light-emitting display may also include a pixel defining layer having an opening that exposes the anode electrode of each pixel. The hole injection layer, the hole transport layer, the organic light-emitting layer, the electron transport layer, the electron injection layer, and the cathode electrode may be formed on the anode electrode, which is exposed through the opening of the pixel defining layer. The hole transport layer and the organic light-emitting layer may be formed using, for example, an inkjet print method or a nozzle print method.

A lyophilic surface processing layer may be formed on the anode electrode, for example, to improve wettability of a hole transport layer solution. However, when the hole transport layer solution is ejected onto the surface processing layer, the solution may errantly spread toward an adjacent pixel due to its ejection pressure and speed.

As a result, the hole transport layer may be formed up to part of the adjacent pixel. The organic light-emitting layer may also be formed on the hole transport layer up to part of the adjacent pixel. Therefore, organic light-emitting layers that emit light of different colors may overlap each other in adjacent pixels. Consequently, an unwanted mixed color may be displayed, to thereby degrade display quality.

SUMMARY

In accordance with one or more embodiments, a light-emitting display device includes a pixel defining layer on the substrate to define each pixel, the pixel defining layer having an opening to expose the first electrode; a charge injection layer on the first electrode; a surface processing layer on the charge injection layer, the surface processing layer extending from inside the opening of the pixel defining layer to a top surface of the pixel defining layer, the surface processing layer including a plurality of grooves in a portion extending on the top surface of the pixel defining layer; a charge transport layer on the surface processing layer; a light-emitting layer on the charge transport layer; and a second electrode on the light-emitting layer.

The grooves may be on at least one side of the opening along a first direction, and the first direction may be toward an adjacent pixel which emits light of a different color from a color of light emitted from a pixel in which the surface processing layer is formed. The grooves may be shaped substantially as straight lines that extend along a second direction crossing the first direction. The grooves may have widths that increase in a direction toward the adjacent pixel. The grooves may have substantially equal widths. The grooves may have an oblique shape between the first direction and a second direction crossing the first direction. The grooves may have a lattice shape.

The pixels may include pixels arranged in a row and that emit light of a same color, and the surface processing layer may be formed in units of the pixels. The charge transport layer may be conformally formed along the surface processing layer.

In accordance with another embodiment, a light-emitting display device may include a substrate including a plurality of pixels; a first electrode on the substrate for each pixel; a pixel defining layer on the substrate to define each pixel, the pixel defining layer has an opening to expose the first electrode; a first common layer on the first electrode; a surface processing layer on the first common layer, the surface processing layer extending from inside the opening of the pixel defining layer to a top surface of the pixel defining layer, the surface processing layer including a plurality of grooves in a portion extending on the top surface of the pixel defining layer; a light-emitting layer on the surface processing layer; and a second electrode on the light-emitting layer.

The grooves may be on at least one side of the opening in a first direction, and the first direction may be toward an adjacent pixel which emits light of a different color from a color of light emitted from a pixel in which the surface processing layer is formed. The grooves may be shaped substantially in straight lines that extend along a second direction crossing the first direction. The grooves may have an oblique shape between the first direction and a second direction crossing the first direction. The grooves may have a lattice shape.

The pixels may include pixels arranged in a row and that emit light of a same color, and the surface processing layer may be formed in units of the pixels. The light-emitting layer may be conformally formed along the surface processing layer.

In accordance with another embodiment, a method for manufacturing a light-emitting display device includes forming a first electrode for each of a plurality of pixels on a substrate; forming a pixel defining layer on the substrate to define each of the pixels, the pixel defining layer having an opening to expose the first electrode of each of the pixels; forming a charge injection layer on the first electrode; forming a surface processing layer on the charge injection layer, the surface processing layer extending from inside the opening of the pixel defining layer to a top surface of the pixel defining layer and having a plurality of grooves in a portion extending on the top surface of the pixel defining layer; forming a charge transport layer on the surface processing layer; forming a light-emitting layer on the charge transport layer; and forming a second electrode on the light-emitting layer.

The operation of forming the charge transport layer may include providing a charge transport layer solution into the opening of the pixel defining layer and drying the charge transport layer solution, and the operation of forming the light-emitting layer may include providing a light-emitting layer solution into the opening of the pixel defining layer and drying the light-emitting layer solution. The charge transport layer solution and the light-emitting layer solution may include a same solvent. The charge injection layer and the light-emitting layer may be formed using an inkjet print method or a nozzle print method.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
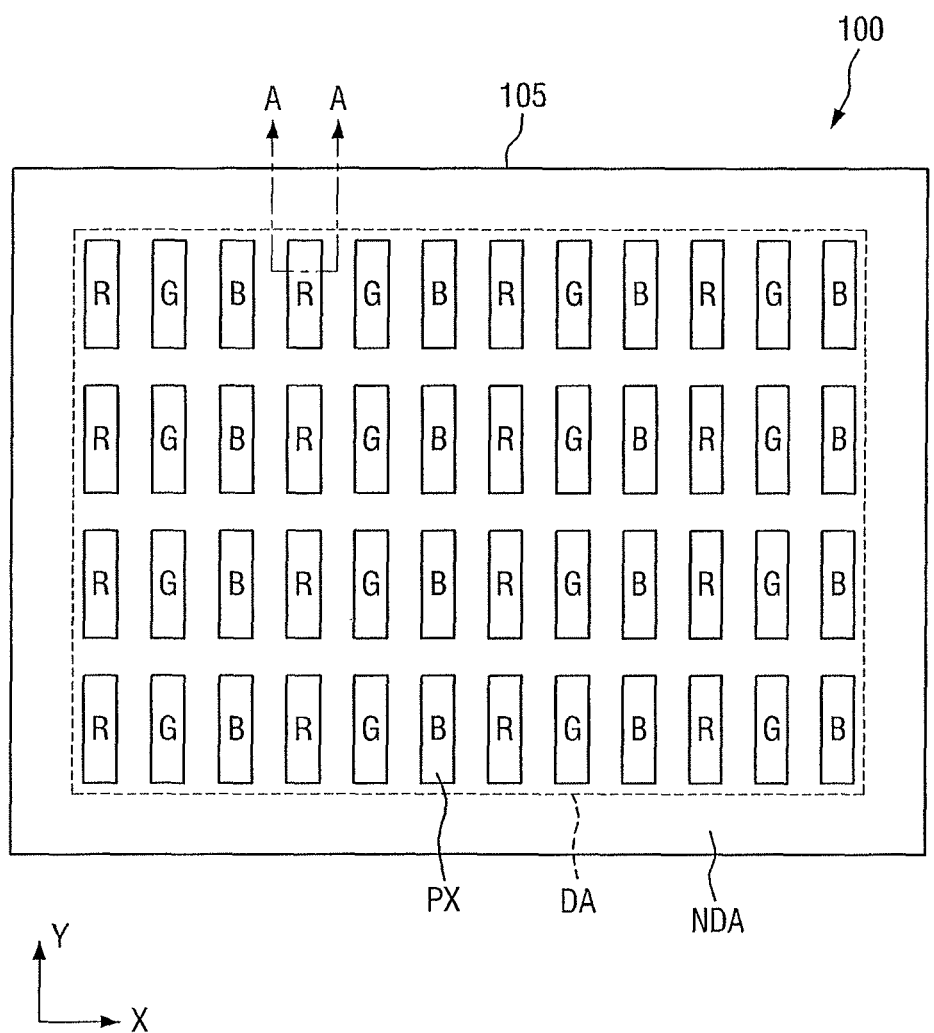
FIG. 1 illustrates an embodiment of pixels of a light-emitting display device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
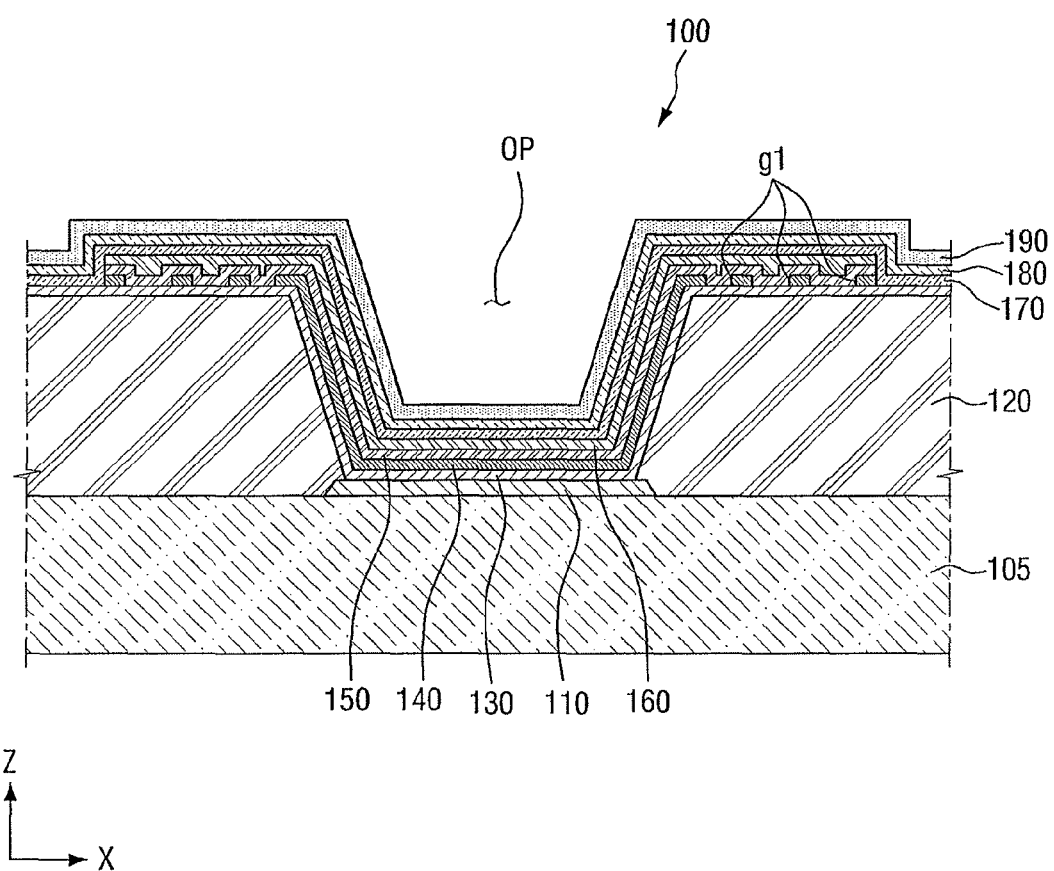
FIG. 2 illustrates a view along section line A-A in FIG. 1.

FIG. 1 illustrates a plurality of pixels PX of a light-emitting display device 100 according to one embodiment, and FIG. 2 is a cross-sectional view along line A-A in FIG. 1. Referring to FIGS. 1 and 2, the light-emitting display device 100 includes a substrate 105, a first electrode 110, a pixel defining layer 120, a first charge injection layer 130, a surface processing layer 140, a first charge transport layer 150, a light-emitting layer 160, a second charge transport layer 170, a second charge injection layer 180, and a second electrode 190. These members are sequentially stacked in a predetermined (e.g., Z) direction in FIG. 2.

The substrate 105 includes a display area DA and a non-display area NDA. The pixels PX are in the display area DA, and the non-display area NDA is outside the display area DA. The pixels PX may include, for example, red pixels (or sub-pixels) R that emit red light, green pixels (or sub-pixels) G that emit green light, and blue pixels (or sub-pixels) B that emit blue light. In FIG. 1, pixels PX that emit light of the same color are arranged in a row along a predetermined (e.g., Y) direction, and pixels PX that emit light of different colors are alternately arranged in a row along a predetermined (e.g., X) direction. The arrangement of pixels PX may be different in other embodiments.

When the pixels PX that emit light of the same color are arranged in a row, a first charge transport layer solution 150a (see FIG. 4) and a light-emitting layer solution may be ejected in one direction, when the first charge transport layer 150 and the light-emitting layer 160 are formed using an inkjet print method or a nozzle print method. Therefore, the ejection process may be performed easily. For example, the inkjet print method may dispense a solution to be printed at a desired position in the form of ink droplets. The nozzle print method may cause a solution to be printed to flow along a line including a desired position.

The substrate 105 may include an insulating substrate. The insulating substrate may include, for example, a transparent glass material containing $SiO_2$ as a main component. In one embodiment, the insulating substrate may include an opaque or plastic material. The insulating substrate may be, for example, a flexible substrate.

The substrate 105 may include or support other structures formed on the insulating substrate. Examples include various types of wiring, electrodes, and insulating layers. In one embodiment, the substrate 105 may include a plurality of thin-film transistors (TFTs) on the insulating substrate. Drain electrode of each TFT may be electrically connected to a first electrode 110. Also, each TFT may include an active region that includes, for example, amorphous silicon, polycrystalline silicon, or monocrystalline silicon. In another embodiment, each TFT may include an active region that includes an oxide semiconductor.

The first electrode 110 is formed on the substrate 105 in each pixel PX. The first electrode 110 may be an anode electrode, which provides holes to the light-emitting layer 160 in response to a signal transmitted to a corresponding TFT, or a cathode electrode, which provides electrons to the light-emitting layer 160 in response to the signal transmitted to the TFT. The first electrode 110 may be used as a transparent electrode or a reflective electrode. When used as a transparent electrode, the first electrode 110 may include, for example, indium tin oxide (ITO), indium zinc oxide (IZO), zinc oxide (ZnO), or $In_2O_3$. When used as a reflective electrode, the first electrode 110 may include a reflective layer using Ag, Mg, Al, Pt, Pd, Au, Ni, Nd, Ir, Cr, or a compound of the same, and may include ITO, IZO, ZnO or $In_2O_3$ on the reflective layer. The first electrode 110 may be formed by, but not limited to, a photolithography process.

The pixel defining layer 120 defines each pixel PX on the substrate 105 and has an opening OP that exposes the first electrode 110. Accordingly, the first charge injection layer 130 is formed on the first electrode 110 through the opening OP of the pixel defining layer 120. The pixel defining layer 120 may include an insulating material. For example, the pixel defining layer 120 may include at least one organic material, e.g., benzocyclobutene (BCB), polyimide (PI), polyamide (PA), acrylic resin, or phenolic resin. In another example, the pixel defining layer 120 may include an inorganic material, e.g., silicon nitride. The pixel defining layer 120 may be formed, for example, by a photolithography process or another process.

In the current embodiment, the pixel defining layer 120 includes an insulating material that causes a contact angle of the first charge transport layer solution 150a (see, e.g., FIG. 4) relative to the pixel defining layer 120 and a contact angle of the first charge transport layer solution 150a (see, e.g., FIG. 4) relative to the surface processing layer 140 to be different when the first charge transport layer 150 is formed using an inkjet print method or nozzle print method.

For example, the pixel defining layer 120 may include an insulating material that causes the contact angle of the first charge transport layer solution 150a relative to the pixel defining layer 120 to be greater than the contact angle of the first charge transport layer solution 150a relative to the surface processing layer 140. In one embodiment, the pixel defining layer 120 may include an insulating material that causes the contact angle of the first charge transport layer solution 150a relative to the pixel defining layer 120 to be 40 degrees or more.

The first charge injection layer 130 may be on the first electrode 110 exposed through the opening OP of the pixel defining layer 120 to entirely cover the pixel defining layer 120. The first charge injection layer 130 may be a hole injection layer receiving holes from the first electrode 120, or an electron injection layer receiving electrons from the first electrode 120. A case where the first charge injection layer 130 is a hole injection layer will be described as an example.

The first charge injection layer 130 is a buffer layer that lowers an energy barrier between the first electrode 110 and the first charge transport layer 150. The first charge injection layer 130 facilitates injection of holes from the first electrode 110 to the first charge transport layer 150. The first charge injection layer 130 may include, for example, an organic compound such as but not limited to 4,4',4''-tris(3-methylphenylphenylamino)triphenylamine (MTDATA), copper phthalocyanine (CuPc), or poly(3,4-ethylenedioxythiphene, polystyrene sulfonate) (PEDOT/PSS). The first charge injection layer 130 may be coated, for example, by a slit coating process.

The surface processing layer 140 is formed on the first charge injection layer 130 in each pixel PX. The surface processing layer 140 may be formed, for example, on the first charge injection layer 130 to extend from inside the opening OP of the pixel defining layer 120 to a top surface of the pixel defining layer 120. The surface processing layer 140 may have a plurality of grooves g1 in a portion extending on the top surface of the pixel defining layer 120. The surface processing layer 140 may be formed, for example, by a photolithography process.

The surface processing layer 140 may include a conductive primer that causes the surface processing layer 140 to be more lyophilic to the first charge transport layer solution 150a (see, e.g., FIG. 4) than the pixel defining layer 120, e.g., causes the contact angle of the first charge transport layer solution 150a (see FIG. 4) relative to the surface processing layer 140 to be smaller than the contact angle of the first charge transport layer solution 150a (see, e.g., FIG. 4) relative to the pixel defining layer 120.

For example, the surface processing layer 140 may include a conductive primer that causes the contact angle of the first charge transport layer solution 150a relative to the surface processing layer 140 to be 20 degrees or less. In this case, when the first charge transport layer solution 150a is ejected onto the surface processing layer 140 (inside the opening OP of the pixel defining layer 120 in each pixel PX) using an inkjet print method or nozzle print method, the first charge transport layer solution 150a may be stably confined within the corresponding pixel PX without spreading to the exposed top surface of the pixel defining layer 120 (e.g., due to high wettability of the first charge transport layer solution 150a relative to the surface processing layer 140). Also, the first charge transport layer 150 may be uniformly formed on the surface processing layer 140. The qualify of high wettability may mean, for example, that a liquid is widely spread over the surface of a solid to contact a wide area of the surface.

The first charge transport layer 150 is formed on the surface processing layer 140. The first charge transport layer 150 may be conformally formed along the surface processing layer 140 having the grooves g1. The first charge transport layer 150 at least partially fills the grooves g1 of the surface processing layer 140.

The first charge transport layer 150 may be a hole transport layer receiving holes from the first charge injection layer 130 via the surface processing layer 140, or an electron transport layer receiving electrons from the first charge injection layer 130 via the surface processing layer 140. A case where the first charge transport layer 130 is a hole transport layer will be described as an example.

The first charge transport layer 150 may transport holes from the first charge injection layer 130 via the surface processing layer 140 to the light-emitting layer 160. The first charge transport layer 150 may include, for example, an organic compound such as but not limited to N,N'-diphenyl-N,N'-bis(3-methylphenyl)-1,1'-bi-phenyl-4,4'-diamine (TPD) or N,N'-di(naphthalen-1-yl)-N,N'-diphenyl-benzidine (NPB). The first charge transport layer 150 may be formed, for example, using an inkjet print method or nozzle print method.

The light-emitting layer 160 is formed on the first charge transport layer 150. The light-emitting layer 160 emits light when holes from the first electrode 110 and electrons from the second electrode 190 recombine. The holes and electrons provided to the light-emitting layer 160 combine to form excitons. When the excitons change from an excited state to a ground state, the light-emitting layer 160 emits light. The light-emitting layer 160 may include, for example, a red light-emitting layer to emit red light, a green light-emitting layer to emit green light, and a blue light-emitting layer to emit blue light. The light-emitting layer 160 may be formed, for example, using an inkjet print method or nozzle print method.

The red light-emitting layer may include one red light-emitting material or a host and a red dopant. Examples of the host of the red light-emitting layer include but are not limited to $Alq_3$, 4,4'-N,N'-dicarbazol-biphenyl (CBP), poly (n-vinylcarbazole) (PVK), 9,10-Di(naphthyl-2-yl)anthracene (ADN), 4,4',4''-tris(N-carbazolyl)triphenylamine (TCTA), 1,3,5-tris(N-phenylbenzimidazol-2-yl)benzene (TPBI), 3-tert-butyl-9,10-di(naphth-2-yl) anthracene (TBADN), terfluorene (E3), distyrylarylene (DSA). In addition, examples of the red dopant include but are not limited to PtOEP, $Ir(piq)_3$ and $Btp_2Ir(acac)$.

The green light-emitting layer may include one green light-emitting material or a host and a green dopant. The host of the red light-emitting layer may be used as the host of the green light-emitting layer. Examples of the green dopant may include but are not limited to Ir(ppy)$_3$, Ir(ppy)$_2$(acac) and Ir(mpyp)$_3$.

The blue light-emitting layer may include one blue light-emitting material or a host and a blue dopant. The host of the red light-emitting layer may be used as the host of the blue light-emitting layer. Examples of the blue dopant include but are not limited to F$_2$Irpic, (F$_2$ppy)$_2$Ir(tmd), Ir(dfppz)$_3$, ter-fluorene, 4,4'-bis(4-diphenylaminostyryl) biphenyl (DPAVBi), 2,5,8,11-tetra-ti-butyl pherylene (TBPe).

The second charge transport layer 170 may be formed on the light-emitting layer 160. The second charge transport layer 170 may be an electron transport layer receiving electrons from the second electrode 190 via the second charge injection layer 180, or a hole transport layer receiving holes from the second electrode 190 via the second charge injection layer 180. A case where the second charge transport layer 170 is an electron transport layer will be described as an example.

The second charge transport layer 170 may transport electrons from the second electrode 190 via the second charge injection layer 180 to the light-emitting layer 160. The second charge transport layer 170 may include, for example, an organic compound such as but not limited to 4,7-diphenyl-1,10-phenanthroline) (Bphen), BAlq, tris(8-quinolinorate)aluminum (Alq3), berylliumbis(benzoquinolin-10-olate) (Bebq$_2$), or TPBI. The second charge transport layer 170 may be formed, for example, by a deposition process.

The second charge injection layer 180 may be formed on the second charge transport layer 170. The second charge injection layer 180 may be an electron injection layer receiving electrons from the second electrode 190, or a hole injection layer receiving holes from the second electrode 190. A case where the second charge injection layer 180 is an electron injection layer will be described as an example.

The second charge injection layer 180 is a buffer layer that lowers an energy barrier between the second charge transport layer 170 and the second electrode 190. The second charge injection layer 180 facilitates the injection of electrons from the second electrode 190 to the second charge transport layer 170. The second charge injection layer 180 may include, for example, LiF or CsF. The second charge injection layer 180 may be formed, for example, by a deposition process.

The second electrode 190 may be formed on the second charge injection layer 180. The second electrode 190 may be a cathode electrode providing electrons to the light-emitting layer 160 or an anode electrode providing holes to the light-emitting layer 160. Like the first electrode 110, the second electrode 190 may be used as a transparent electrode or a reflective electrode. The second electrode 190 may be formed, for example, by a deposition process.

The light-emitting display device 100 may further include an encapsulation substrate on the second electrode 190. The encapsulation substrate may be an insulating substrate. A spacer may be between the second electrode 190 on the pixel defining layer 120 and the encapsulation substrate. The encapsulation layer made of an insulating material may cover and thus protect the entire structure. In other embodiments, the encapsulation substrate may be omitted.

Figure 3:
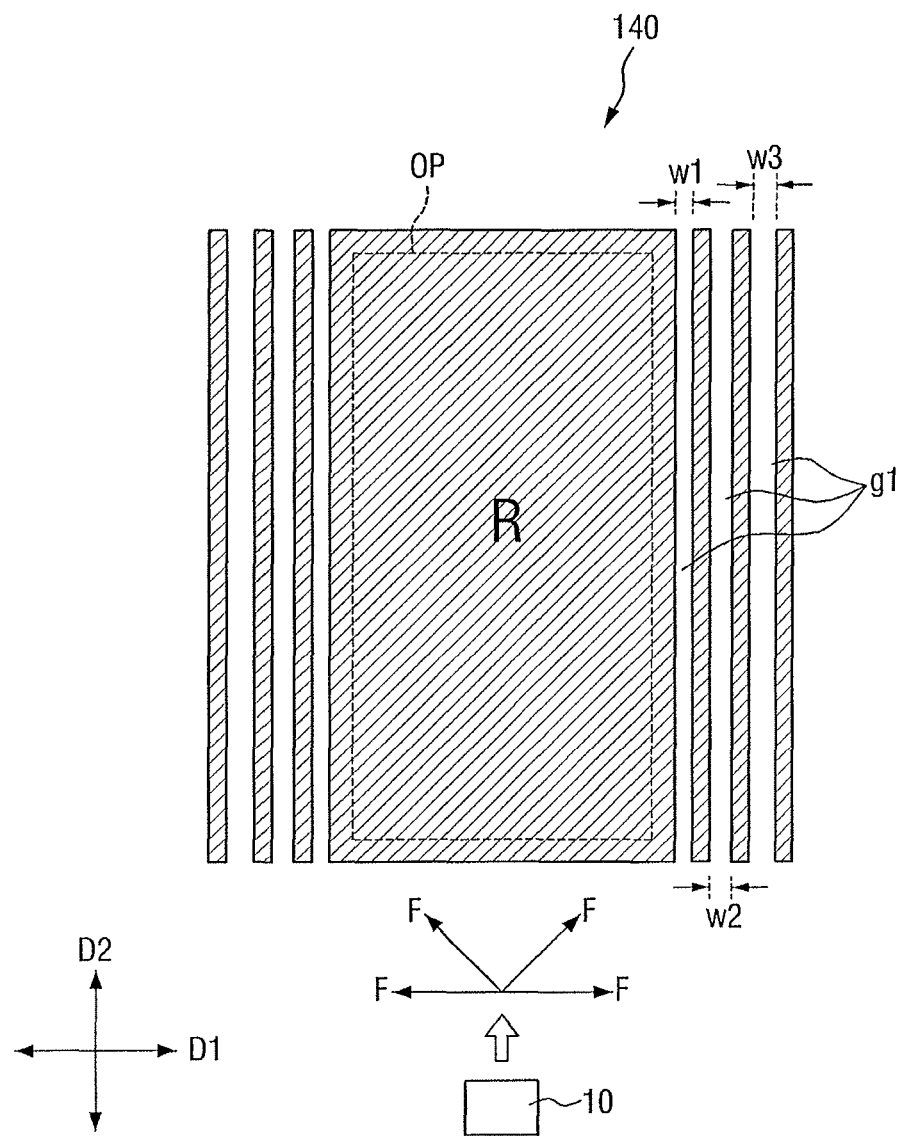
FIG. 3 illustrates an embodiment of a surface processing layer.
Figure 4:
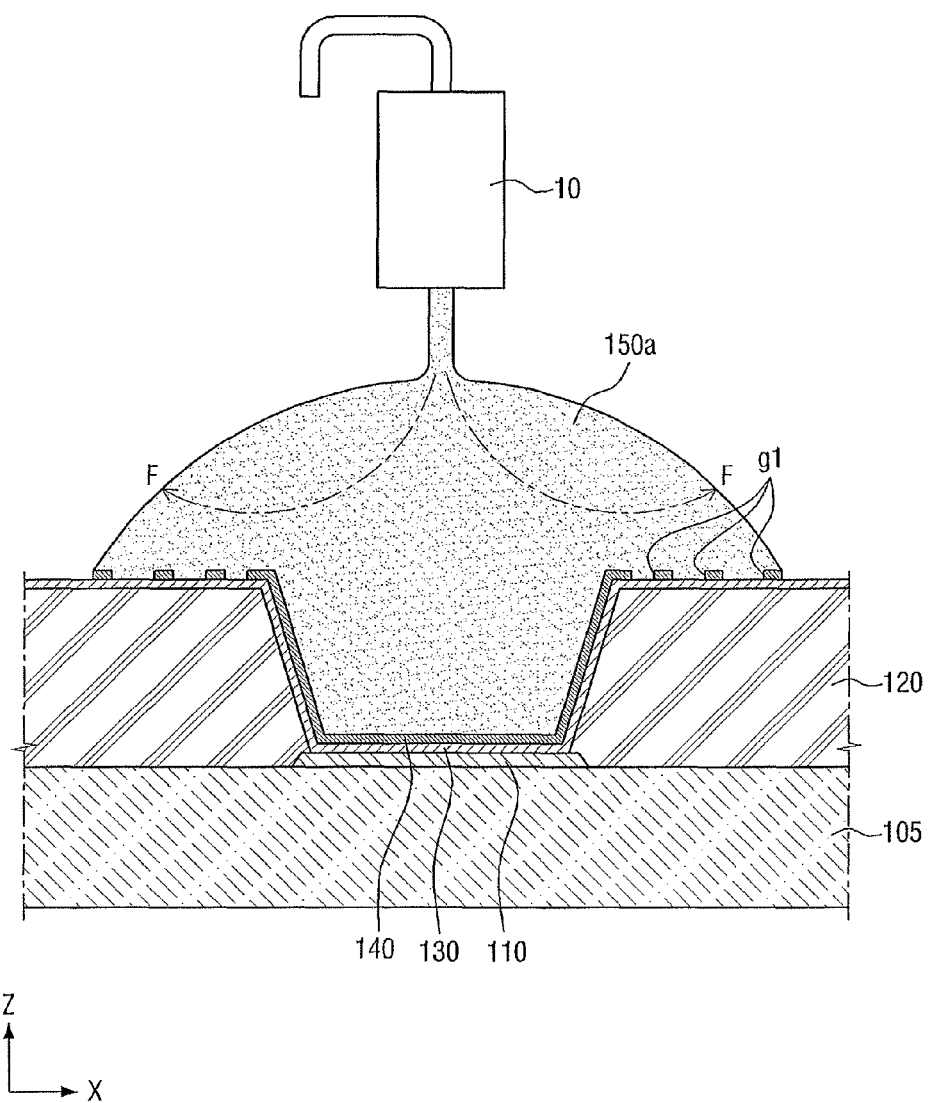
FIG. 4 illustrates an embodiment of a method for ejecting a first charge transport layer solution onto the surface processing layer.
Figure 5:
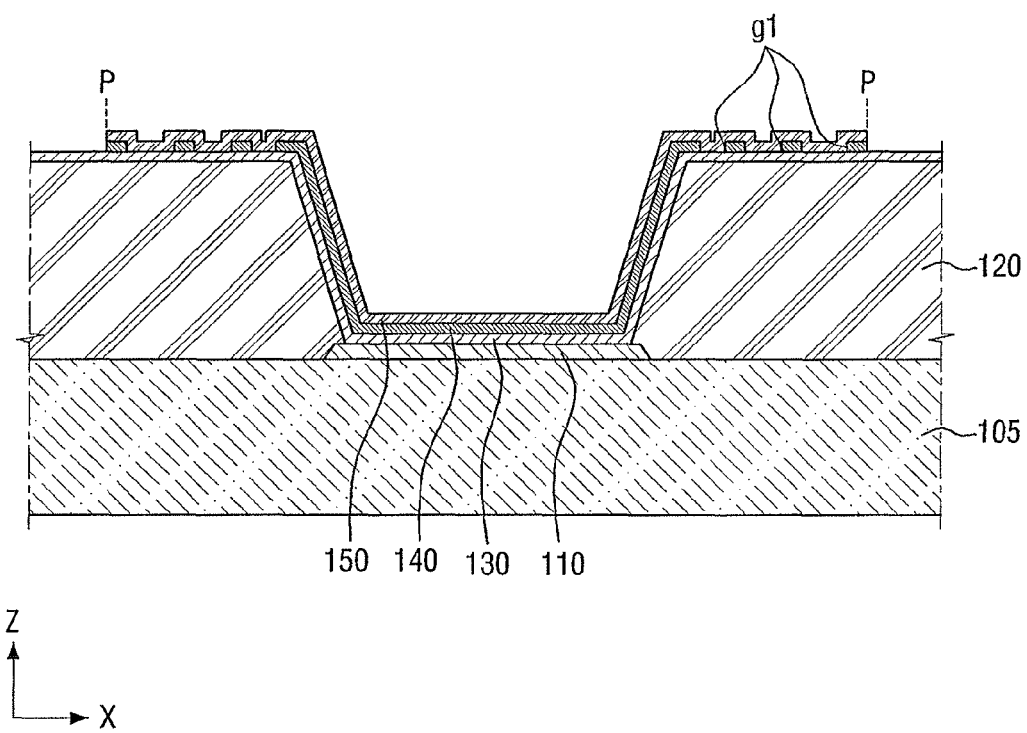
FIG. 5 illustrates an embodiment of a first charge transport layer.

FIG. 3 illustrates an embodiment of a surface processing layer, which, for example, may correspond to the surface processing layer 140 in FIG. 2. FIG. 4 illustrates an example of a method for ejecting the first charge transport layer solution 150*a* onto the surface processing layer 140 in FIG. 3. FIG. 5 is a cross-sectional view of the first charge transport layer 150 formed by drying the charge transport layer solution 150*a* in FIG. 4.

Referring to FIG. 3, the surface processing layer 140 has the grooves g1 in at least one side portion thereof. The grooves g1 may be on at least one side of the opening OP of the pixel defining layer 120. A direction of one side portion or one side may be a first direction D1 toward an adjacent pixel PX, which emits light of a color different from the color of light emitted from a corresponding pixel PX in which the surface processing layer 140 is formed. For example, in the case where a red pixel R emitting red light and a green pixel G emitting green light are adjacent to each other, the surface processing layer 140 formed in the red pixel R has the grooves g1 in a side portion thereof in a direction in which the green pixel G is disposed. In FIG. 3, the grooves g1 are formed in two side portions of the surface processing layer 140, based on the assumption that pixels PX emitting light of different colors are disposed on two sides of one pixel PX.

The grooves g1 may be shaped, for example, in straight lines that extend along a second direction D2 crossing or perpendicular to the first direction D1 toward the adjacent pixel PX. The grooves g1 form roughness at an edge of the surface processing layer 140. Accordingly, when the first charge transport layer solution 150*a* is ejected from an ejection device 10 onto the surface processing layer 140 using, e.g., a nozzle print method, the grooves g1 of the surface processing layer 140 may increase the contact angle of the first charge transport layer solution 150*a* relative to the edge of the surface processing layer 140. As a result, the first charge transport layer solution 150*a* may be confined in the grooves g1, and thus the first charge transport layer solution 150*a* is prevented from spreading beyond the surface processing layer 140.

For example, the grooves g1 of the surface processing layer 140 may increase resistance to a force F (e.g., generated by ejection pressure and ejection speed) with which the first charge transport layer solution 150*a* ejected from the ejection device 10 spreads beyond the surface processing layer 140. This may confine the first charge transport layer solution 150*a* in the grooves g1 while preventing the first charge transport layer solution 150*a* from spreading beyond the surface processing layer 140. Thus, it is possible to reduce or prevent the first charge transport layer solution 150*a* from flowing to an adjacent pixel PX (for example, a pixel PX that emits light of a different color) and unwantedly spreading to part of the adjacent pixel PX.

In one embodiment, the widths w1, w2, or w3 of the grooves g1 may increase toward an adjacent pixel PX. The grooves g1 may therefore reduce or prevent a sharp increase in the contact angle of the first charge transport layer solution 150*a* relative to the edge of the surface processing layer 140. As a result, the first charge transport layer solution 150*a* may spread over a large area of the surface processing layer 140. Accordingly, when the first charge transport layer solution 150*a* ejected onto the surface processing layer 140 dries to form the first charge transport layer 150 as in FIG. 5, the first charge transport layer 150 may be formed over a large area of the surface processing layer 140.

The first charge transport layer 150, formed by the drying of the first charge transport layer solution 150*a*, forms pinning points P with the surface processing layer 140 as illustrated in FIG. 5. In this case, the light-emitting layer 160 may be formed to be aligned with the pinning points P by ejecting a light-emitting layer solution, which contains the same solvent as the first charge transport layer solution 150a, onto the first charge transport layer 150 using an inkjet print method or nozzle print method, and drying the light-emitting layer solution. Thus, edges of the light-emitting layer 160 may be aligned with the edges of the first charge transport layer 150.

Figure 6:
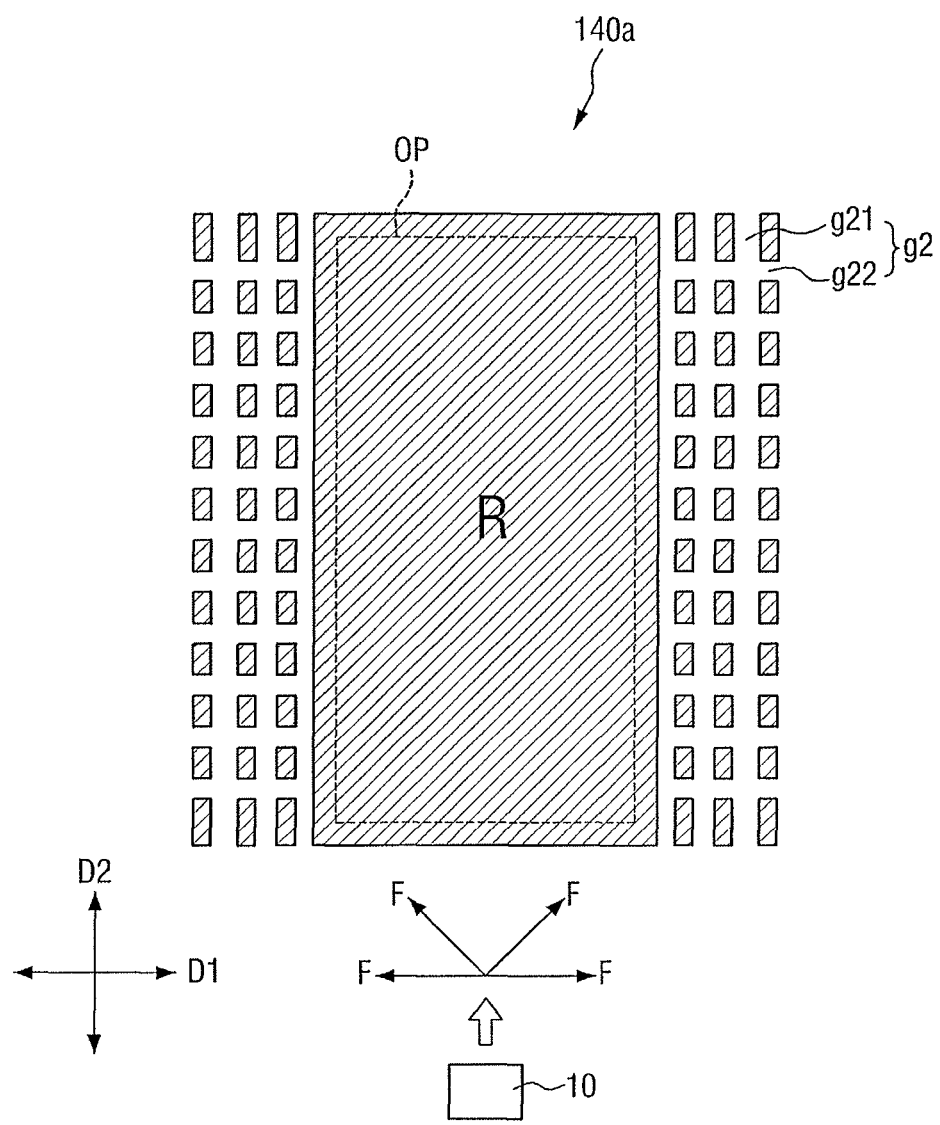
FIGS. 6-12 illustrate various embodiments of a surface processing layer.

FIGS. 6 through 12 illustrate various embodiments of the surface processing layer 140. Referring to FIG. 6, a surface processing layer 140a includes a plurality of grooves g2 having a lattice shape in at least one side portion thereof. The grooves g2 are formed by orthogonal intersection of first grooves g21 and second grooves g22. The first grooves g21 are shaped in straight lines that extend along a second direction D2 crossing or perpendicular to a first direction D1 toward an adjacent pixel PX. The second grooves g22 are shaped in straight lines that extend along the first direction D1. The first grooves g21 may become wider along the first direction D1.

When a force F (with which a first charge transport layer solution ejected onto the surface processing layer 140a by moving an ejection device 10 spreads beyond the surface processing layer 140a) is generated in the first direction D1 and a diagonal direction between the first direction D1 and the second direction D2, the grooves g2 may effectively prevent the first charge transport layer solution from spreading along not only the first direction D1 but also the diagonal direction.

Figure 7:
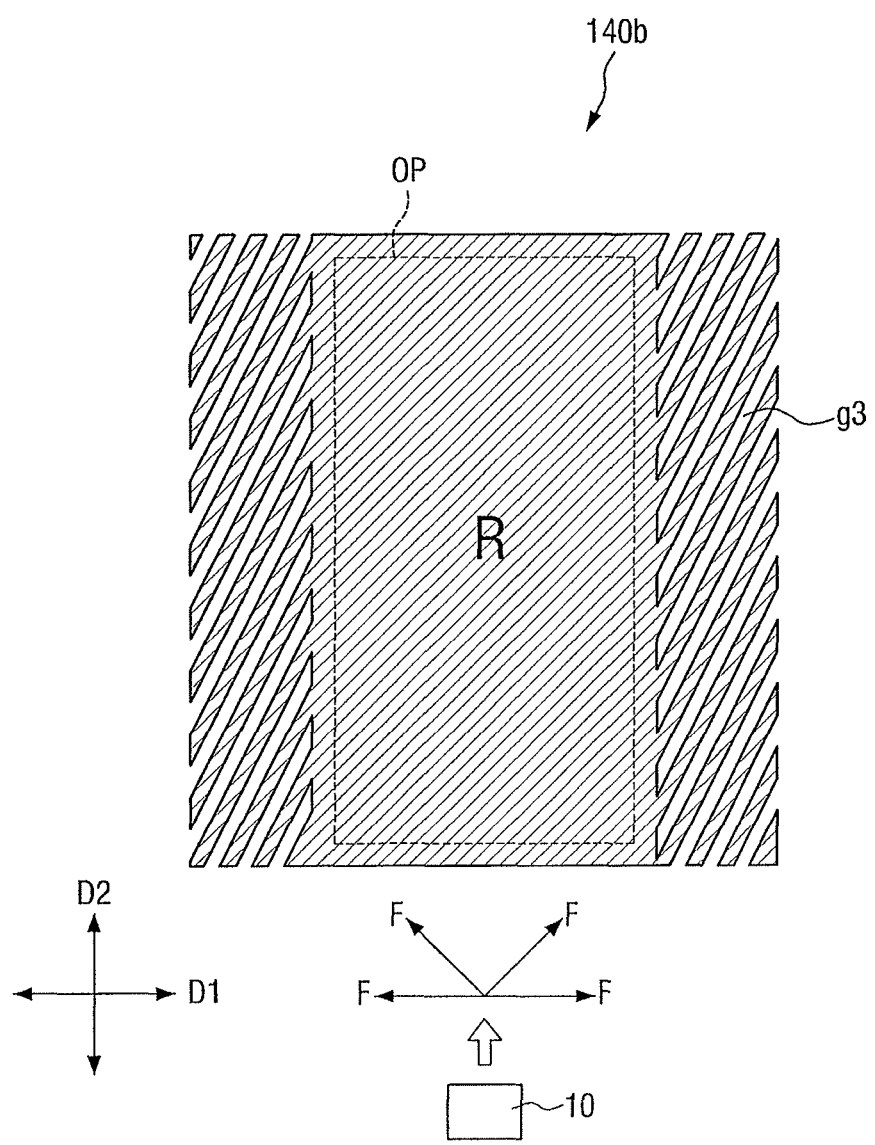

Referring to FIG. 7, a surface processing layer 140b includes a plurality of oblique grooves g3 in at least one side portion thereof. The grooves g3 are formed obliquely between a first direction D1 toward an adjacent pixel PX and a second direction D2 crossing or perpendicular to the first direction D1. The grooves g3 may have equal widths.

When a force F (with which a first charge transport layer solution ejected onto the surface processing layer 140b by moving an ejection device 10 spreads beyond the surface processing layer 140b) is generated in the first direction D1 and a diagonal direction between the first direction D1 and the second direction D2, the grooves g3 may effectively prevent the first charge transport layer solution from spreading along not only the first direction D1, but also the diagonal direction.

Figure 8:
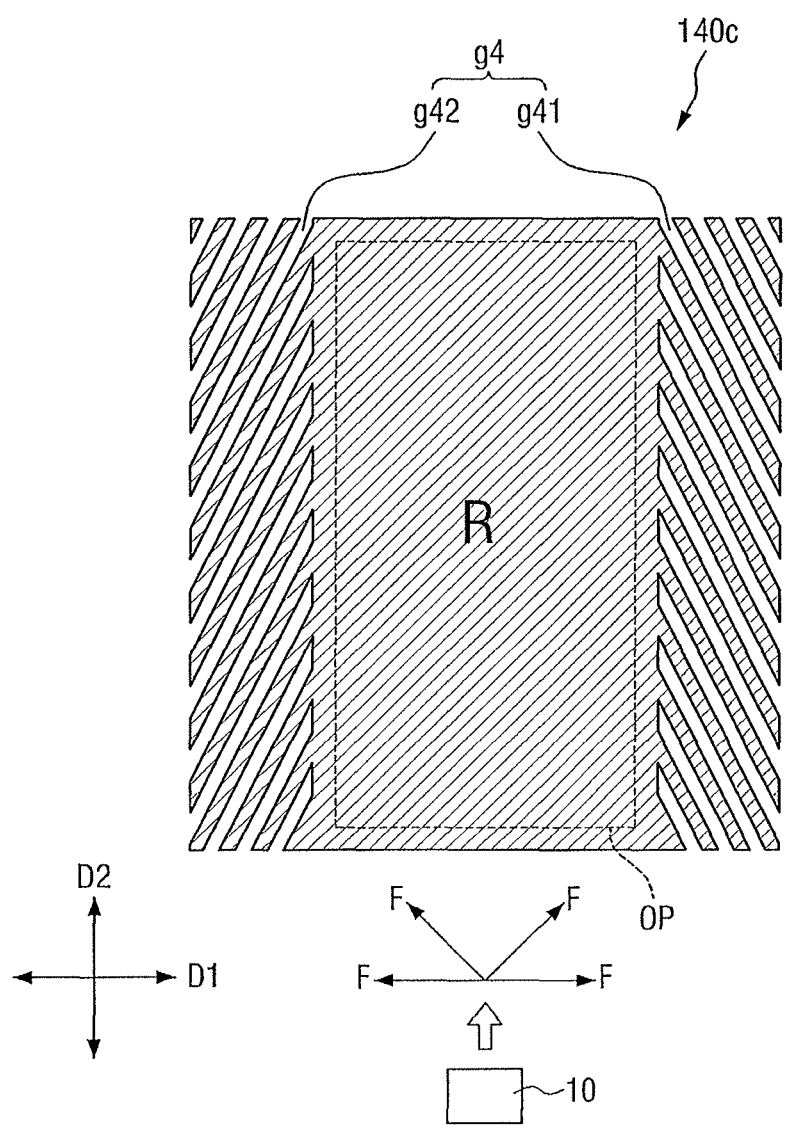

Referring to FIG. 8, a surface processing layer 140c includes a plurality of grooves g4 formed obliquely in different directions in both side portions thereof. For example, the grooves g4 include first grooves g41 and second grooves g42. The first grooves g41 are formed to have a first oblique shape between a first direction D1 toward an adjacent pixel PX and a second direction D2 crossing or perpendicular to the first direction D1. The second grooves g42 are formed to have a second oblique shape which is symmetrical to the first oblique shape with respect to the second direction D2.

When a force F (with which a first charge transport layer solution ejected onto the surface processing layer 140c by moving an ejection device 10 spreads beyond the surface processing layer 140c) is generated in a diagonal direction between the first direction D1 and the second direction D2 at one side portion of the surface processing layer 140c, the first oblique shape is orthogonal to the diagonal direction. Accordingly, the first grooves g41 having the first oblique shape may effectively reduce or prevent the first charge transport layer solution from spreading from the side portion of the surface processing layer 140c in the diagonal direction between the first direction D1 and the second direction D2.

When the force F (with which the first charge transport layer solution ejected onto the surface processing layer 140c by moving the ejection device 10 spreads beyond the surface processing layer 140c) is generated in a diagonal direction between the first direction D1 and the second direction D2 at the other side portion of the surface processing layer 140c, the second oblique shape is orthogonal to the diagonal direction. Accordingly, the second grooves g42 having the second oblique shape may effectively prevent the first charge transport layer solution from spreading from the side portion of the surface processing layer 140c in the diagonal direction between the first direction D1 and the second direction D2.

Thus, when the force F (with which the first charge transport layer solution ejected onto the surface processing layer 140c by moving the ejection device 10 spreads beyond the surface processing layer 140c) is generated in diagonal directions between the first direction D1 and the second direction D2, the grooves g4 may effectively reduce or prevent the first charge transport layer solution from spreading in different diagonal directions.

Figure 9:
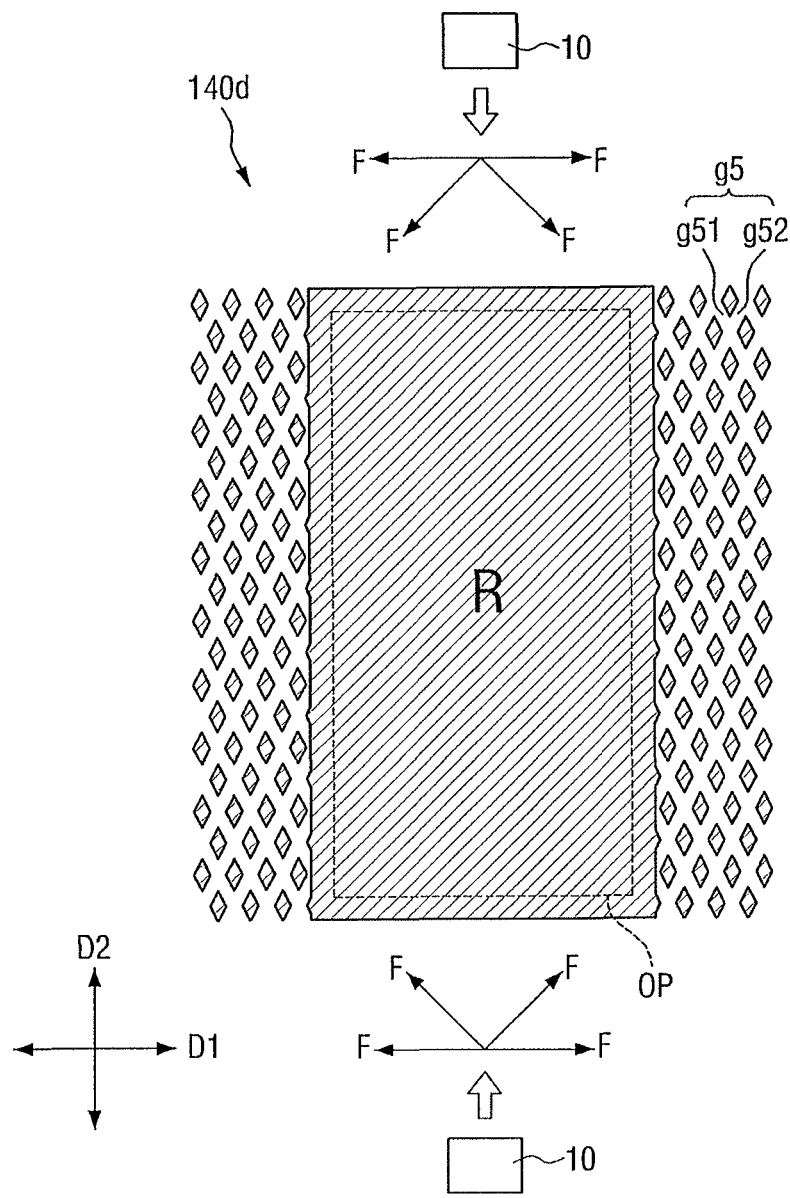

Referring to FIG. 9, a surface processing layer 140d includes a plurality of grooves g5 having a lattice shape. The grooves g5 are formed by orthogonal intersection of first oblique grooves g51 and second oblique grooves g52 in at least one side portion thereof. Even when a movement start point of an ejection device 10 changes, the grooves g5 may effectively reduce or prevent a first charge transport layer solution from spreading, not only in a first direction D1 but also in a diagonal direction between the first direction D1 and a second direction D2.

Figure 10:
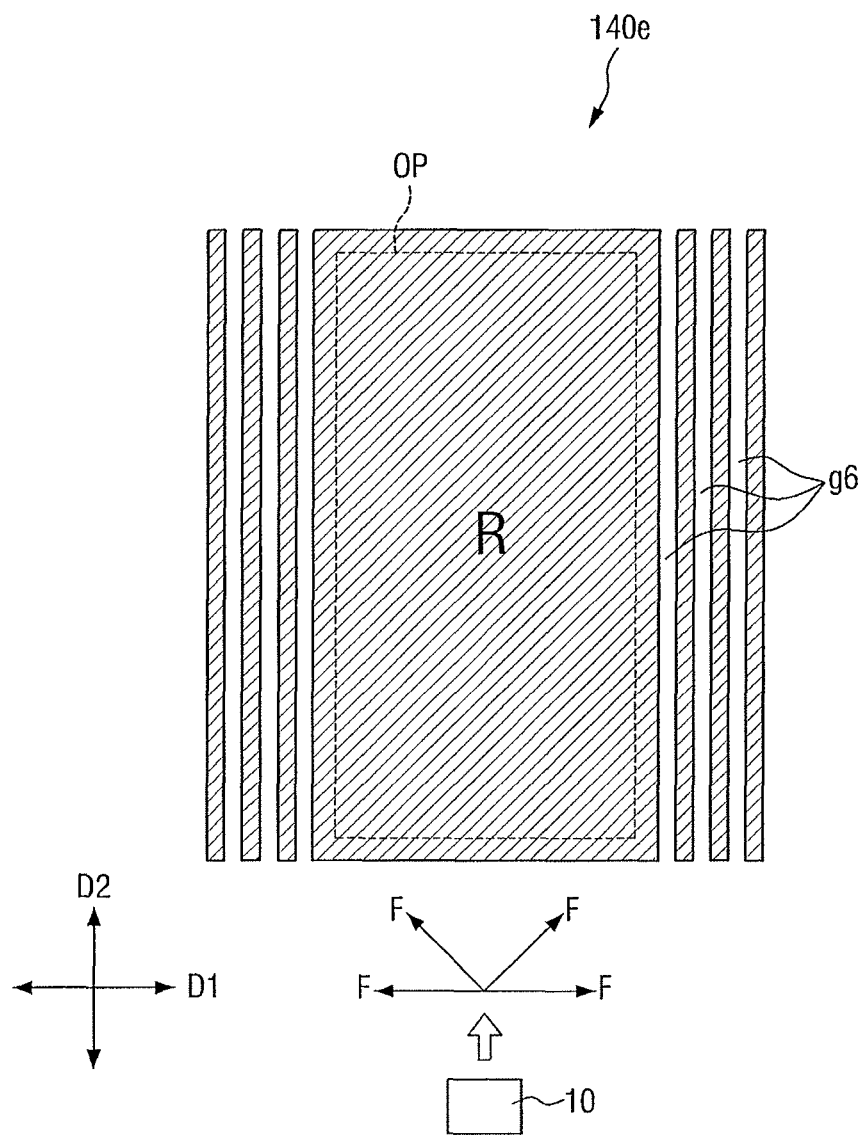

Referring to FIG. 10, a surface processing layer 140e includes a plurality of grooves g6 having equal widths in at least one side portion thereof. The surface processing layer 140e having the grooves g6 may be applied in a limited space, for example, in a case where there is a fine pitch between adjacent pixels PX.

Figure 11:
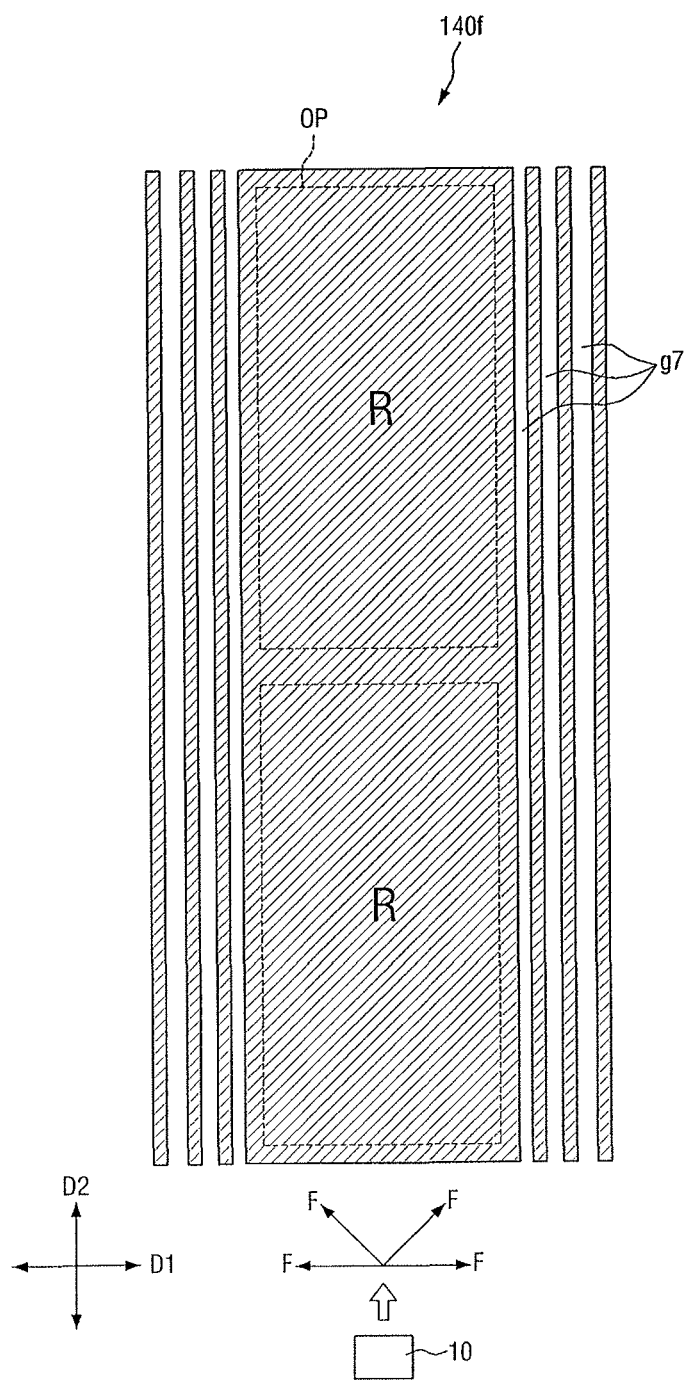

Referring to FIG. 11, a surface processing layer 140f is formed in units of pixels PX that are arranged in a row and emit light of the same color. For example, the surface processing layer 140f may be formed in every two or more pixels PX to be larger in size than the surface processing layer 140 of FIG. 3. However, the surface processing layer 140f may be formed in the same shape as the surface processing layer 140 to have a plurality of grooves g7 extending along a second direction D2 crossing or perpendicular to a first direction D1 toward an adjacent pixel PX which emits light of a different color. When formed by a photolithography process, the surface processing layer 140f may facilitate a patterning process.

Figure 12:
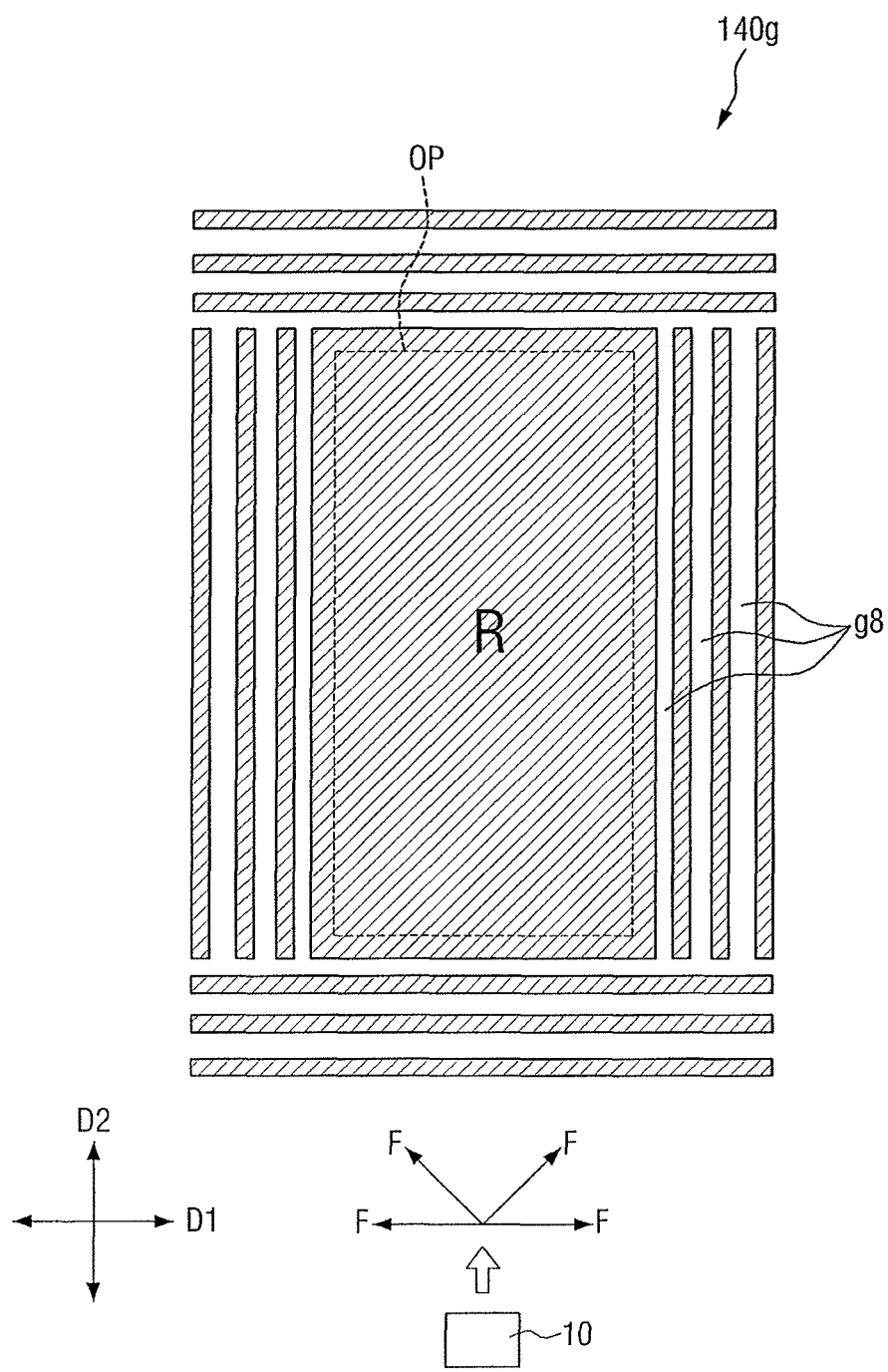

Referring to FIG. 12, a surface processing layer 140g includes a plurality of grooves g8 in all side portions thereof. The grooves g8 are formed in the same shape as the grooves g1 of the surface processing layer 140 of FIG. 3. When pixels PX emitting light of different colors are disposed on all sides of a pixel PX, the grooves g8 may prevent a first charge transport layer solution from spreading in all directions from the surface processing layer 140g when the first charge transport layer solution is ejected onto the surface processing layer 140g using an inkjet print method.

As described above, each of the light-emitting devices according to the aforementioned embodiments include a surface processing layer (140, 140a through 140g) having roughness formed on an edge thereof by a plurality of grooves (g1 through g8). The roughness increases resistance to a force F (e.g., generated by ejection pressure and ejection speed) with which a first charge transport layer solution (150a) ejected onto the surface processing layer (140, 140a through 140g) using an inkjet print method or nozzle print method spreads beyond the surface processing layer (140, 140a through 140g). This may reduce or prevent the first charge transport layer solution (150a) from spreading beyond the surface processing layer (140, 140a through 140g).

Accordingly, the light-emitting display devices according to the one or more embodiments may reduce or prevent the first charge transport layer solution (150a) from spreading to an adjacent pixel PX, for example, a pixel PX that emits light of a different color and unwantedly forming a first charge transport layer (150) up to part of the adjacent pixel PX.

Therefore, the light-emitting display devices according to one or more embodiments may prevent a light-emitting layer (160) from being formed on the first charge transport layer (150) up to part of the adjacent pixel PX, thereby avoiding a situation where light-emitting layers emitting light of different colors overlap each other in adjacent pixels PX. Consequently, this may reduce or prevent degradation of display quality due to the display of an unwanted mixed color on the light-emitting display devices being driven.

Figure 13:
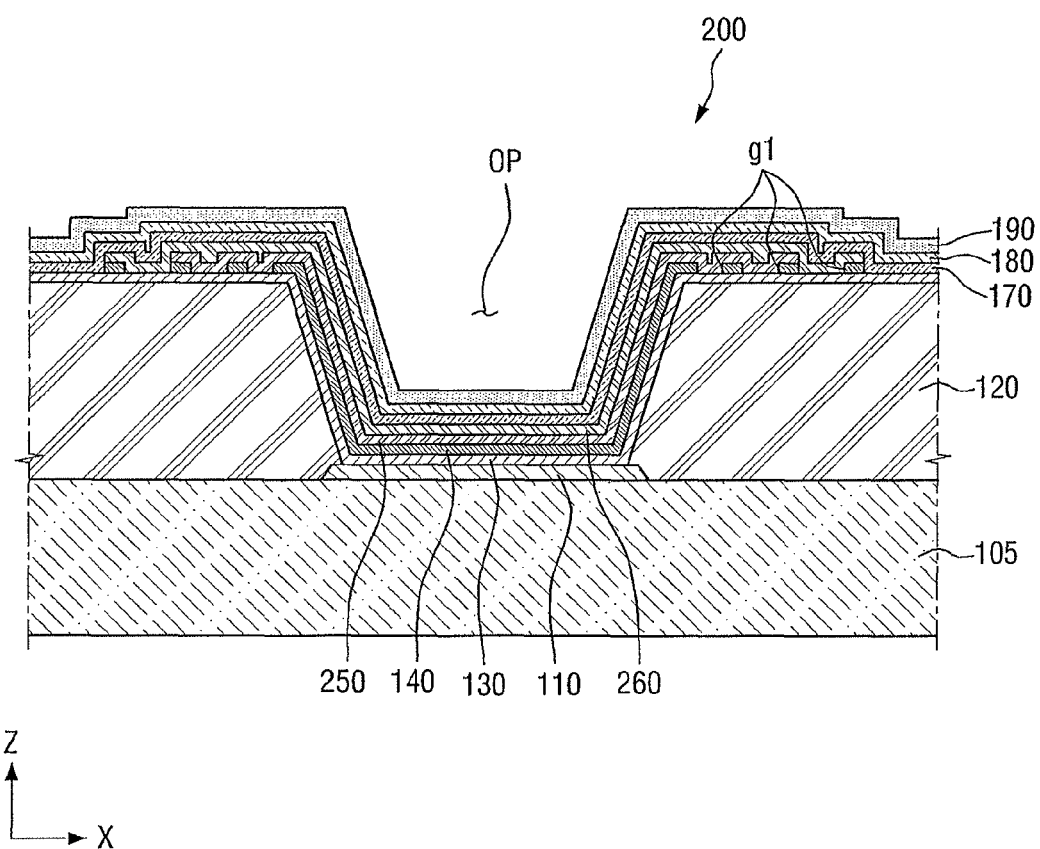
FIG. 13 illustrates a light-emitting display device of another embodiment.

FIG. 13 is a cross-sectional view of another embodiment of a light-emitting display device 200, which may have the same configuration as the light-emitting display device 100 in FIG. 2 except for a first charge transport layer 250 and a light-emitting layer 260.

The first charge transport layer 250 is similar to the first charge transport layer 150 of FIG. 2. However, the first charge transport layer 250 is not formed up to edges of a surface processing layer 140, but rather fills one or more of a plurality of grooves g1. When a first charge transport layer solution is ejected onto the surface processing layer 140 using an inkjet print method or nozzle print method to form the first charge transport layer 250, if the ejection pressure is low, the first charge transport layer solution may not spread to the edges of the surface processing layer 140. As a result, the above structure may be formed.

The light-emitting layer 260 is similar to the light-emitting layer 160 of FIG. 2. Here, the light-emitting layer 260 is formed on the first charge transport layer 250 and extends up to the edges of the surface processing layer 140. This structure may be formed because the surface processing layer 140 is lyophilic, not only to the first charge transport layer solution but also to a light-emitting layer solution, when the light-emitting layer solution has the same solvent as the first charge transport layer solution. The grooves g2 through g7 in the embodiments of FIGS. 6 through 12 may be applied to the grooves g1 of the surface processing layer 140.

Like the light-emitting display device 100, the light-emitting display device 200 includes the surface processing layer 140 having the grooves g1 in at least one side thereof. The surface processing layer 140 having the grooves g1 prevents the light-emitting layer 260 from being formed on the first charge transport layer 250 up to part of an adjacent pixel PX, thereby avoiding a situation where light-emitting layers emitting light of different colors overlap each other in adjacent pixels PX. This may prevent degradation of display quality due to the display of an unwanted mixed color on the light-emitting display device 200 being driven.

Figure 14:
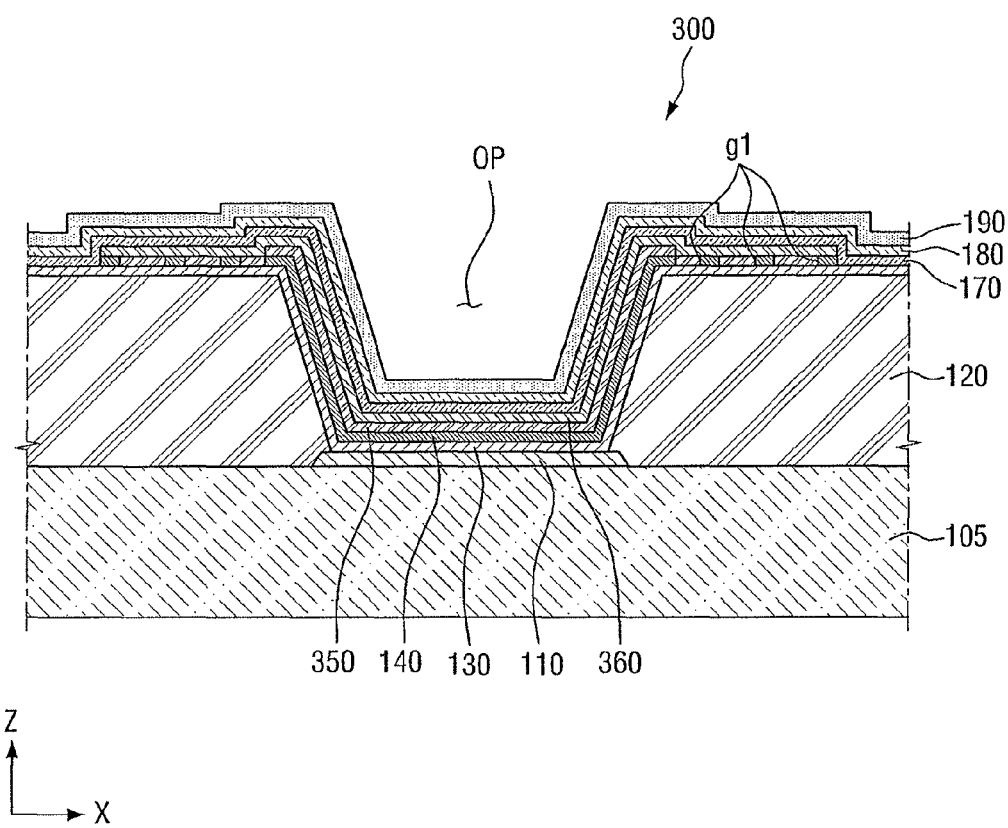
FIG. 14 illustrates a light-emitting display device of another embodiment.

FIG. 14 is a cross-sectional view of another embodiment of a light-emitting display device 300, which may have the same configuration as the light-emitting display device 100 of FIG. 2 except a first charge transport layer 350 and a light-emitting layer 360.

The first charge transport layer 350 is similar to the first charge transport layer 150 of FIG. 2. However, the first charge transport layer 350 is formed on a surface processing layer 140, but not on the surface processing layer 140 between a plurality of grooves g1. For example, a height of the first charge transport layer 350 in the grooves g1 may be equal to or less than a height of the grooves g1. This structure may be formed when a first charge transport layer solution in the grooves g1 of the surface processing layer 140 dries, after being ejected onto the surface processing layer 140 using an inkjet print method or nozzle print method, to form the first charge transport layer 350.

The light-emitting layer 360 is similar to the light-emitting layer 160 of FIG. 2. However, the light-emitting layer 360 is formed on the first charge transport layer 350, and contacts the surface processing layer 140 in the grooves g1 of the surface processing layer 140. This structure may be formed because the surface processing layer 140 is lyophilic, not only to the first charge transport layer solution but also to a light-emitting layer solution, when the light-emitting layer solution has the same solvent as the first charge transport layer solution.

The grooves g2 through g7 in the embodiments of FIGS. 6 through 12 may be applied to the grooves g1 of the surface processing layer 140.

The light-emitting device 300 according to the current embodiment, like the light-emitting display device 100, includes the surface processing layer 140 having the grooves g1 in at least one side thereof. The surface processing layer 140 having the grooves g1 prevents the light-emitting layer 360 from being formed on the first charge transport layer 350 up to part of an adjacent pixel PX, thereby avoiding a situation where light-emitting layers emitting light of different colors overlap each other in adjacent pixels PX. This may reduce or prevent degradation of display quality due to the display of an unwanted mixed color on the light-emitting display device 300 being driven.

Figure 15:
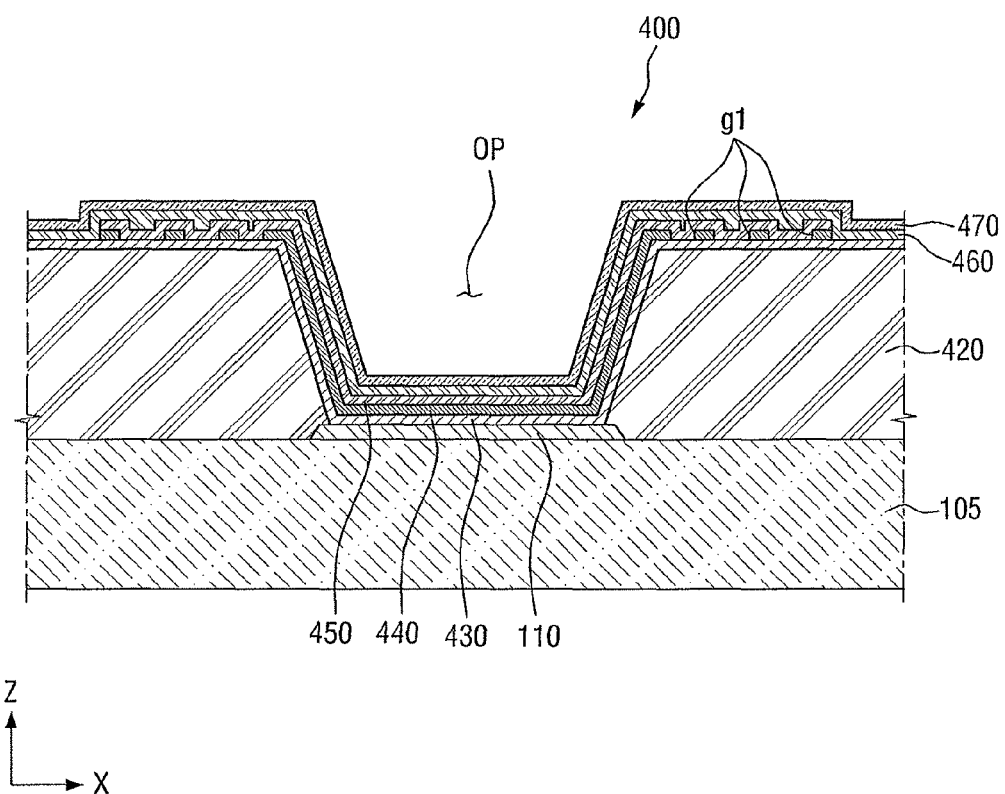
FIG. 15 illustrates a light-emitting display device of another embodiment.

FIG. 15 is a cross-sectional view of another embodiment of a light-emitting display device 400 which includes a substrate 105, a first electrode 110, a pixel defining layer 420, a first common layer 430, a surface processing layer 440, a light-emitting layer 450, a second common layer 460, and a second electrode 470.

The pixel defining layer 420 is similar to the pixel defining layer 120 of FIG. 2. However, the pixel defining layer 420 may include an insulating material that causes a contact angle of a light-emitting layer solution relative to the pixel defining layer 420 and a contact angle of the light-emitting layer solution relative to the surface processing layer 440 to be different, when the light-emitting layer 450 is formed using an inkjet print method or nozzle print method.

For example, the pixel defining layer 420 may include an insulating material that causes the contact angle of the light-emitting layer solution relative to the pixel defining layer 420 to be greater than the contact angle of the light-emitting layer solution relative to the surface processing layer 440. In one embodiment, the pixel defining layer 420 may be made of an insulating material that causes the contact angle of the light-emitting layer solution to the pixel defining layer 420 to be 40 degrees or more.

The first common layer 430 may be formed on the first electrode 110 exposed through an opening OP of the pixel defining layer 420 to entirely cover the pixel defining layer 420. The first common layer 430 includes a first charge injection layer. The first charge injection layer contacts the first electrode 110. In addition, the first common layer 430 may further include a first charge transport layer on the first charge injection layer. The first charge injection layer and the first charge transport layer may include the same material as the first charge injection layer 130 and the first charge transport layer 140 of FIG. 2.

The surface processing layer 440 has a plurality of grooves g1 in at least one side portion thereof, and may be similar to the surface processing layer 140 of FIG. 2. However, the surface processing layer 440 may include a conductive primer that causes the surface processing layer 440 to be more lyophilic to the light-emitting layer solution than the pixel defining layer 420, e.g., causes the contact angle of the light-emitting layer solution relative to the surface processing layer 440 to be smaller than the contact angle of the light-emitting layer solution relative to the pixel defining layer 420. In one embodiment, the surface processing layer 440 may include a conductive primer that causes the contact angle of the light-emitting layer solution relative to the surface processing layer 440 to be 20 degrees or less.

Thus, when the light-emitting layer solution is ejected onto the surface processing layer 440 inside the opening OP of the pixel defining layer 420 in each pixel PX by using an inkjet print method or nozzle print method, the light-emitting layer solution may be stably confined within the corresponding pixel PX without spreading to an exposed top surface of the pixel defining layer 420 due to high wettability of the light-emitting layer solution to the surface processing layer 440. Also, the light-emitting layer 450 may be uniformly formed on the surface processing layer 440.

The light-emitting layer 450 may be similar to the light-emitting layer 160 of FIG. 2. However, the light-emitting layer 450 is formed on the surface processing layer 440. The light-emitting layer 450 may be conformally formed along the surface processing layer 440 having the grooves g1 that form roughness. The light-emitting layer 450 at least partially fills the grooves g1 of the surface processing layer 440.

Because the light-emitting layer 450 is formed directly on the surface processing layer 440, when the light-emitting layer solution is ejected onto the surface processing layer 440 using a nozzle print method to form the light-emitting layer 450, the contact angle of the light-emitting layer solution relative to an edge of the surface processing layer 440 may be prevented from increasing. This may prevent the light-emitting layer solution from spreading beyond the surface processing layer 440, thereby confining the light-emitting layer solution in the grooves g1 of the surface processing layer 440.

The second common layer 460 is formed on the light-emitting layer 450. The second common layer 460 includes a second charge transport layer. The second charge transport layer contacts the light-emitting layer 460. In addition, the second common layer 430 may include a second charge injection layer on the second charge transport layer. The second charge transport layer and the second charge injection layer may include the same material as the second charge transport layer 170 and the second charge injection layer 180 of FIG. 2. The second electrode 470 may be identical to the second electrode 190 of FIG. 2.

The grooves g2 through g7 in the embodiments of FIGS. 6 through 12 may be applied to the grooves g1 of the surface processing layer 440.

The light-emitting device 400 according to the current embodiment, like the light-emitting display device 100, includes the surface processing layer 440 having the grooves g1 in at least one side thereof. The surface processing layer 440 having the grooves g1 prevents the light-emitting layer 450 from being formed on the surface processing layer 440 up to part of an adjacent pixel PX, thereby avoiding a situation where light-emitting layers emitting light of different colors overlap each other in adjacent pixels PX. This may prevent degradation of display quality due to the display of an unwanted mixed color on the light-emitting display device 400 being driven.

Figure 16:
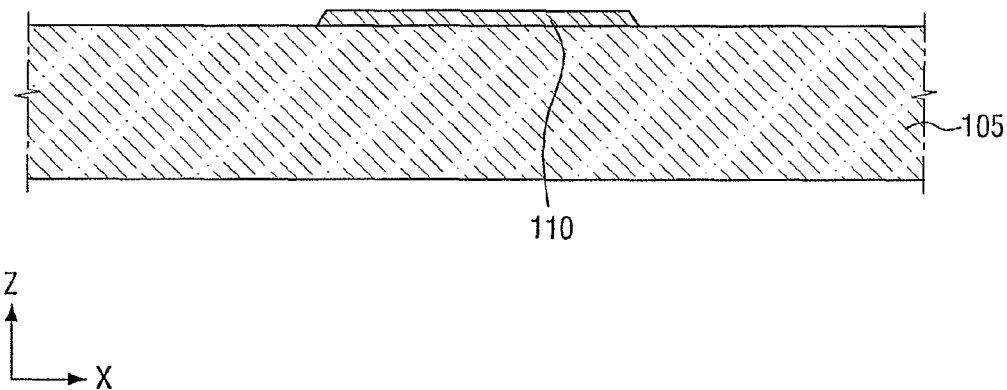
FIGS. 16-24 illustrate an embodiment of a method for manufacturing a light-emitting display device.

FIGS. 16 through 24 are cross-sectional views illustrating an embodiment of a method for manufacturing a light-emitting display device. Referring to FIG. 16, a first electrode 110 is formed on a substrate 105 in each of a plurality of pixels PX (see FIG. 1) defined in the substrate 105. The first electrode 110 may be formed, for example, by depositing a transparent electrode material or a reflective material on the substrate 105 and patterning the transparent electrode material or the reflective material.

Figure 17:
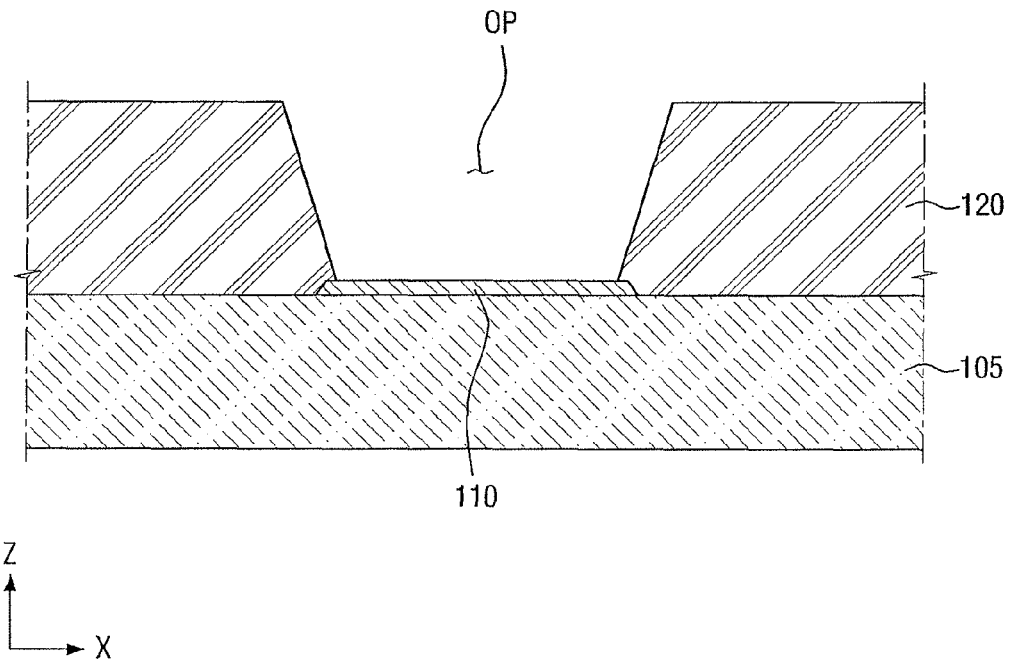
Figure 18:
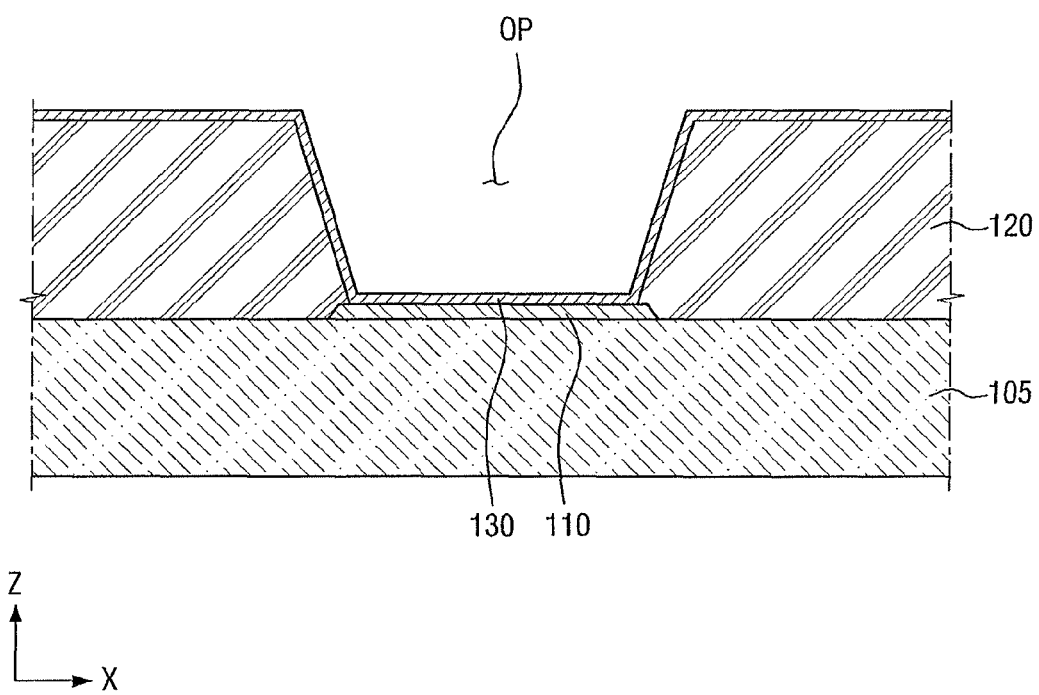

Referring to FIG. 17, a pixel defining layer 120 is formed on the substrate 105 to define each pixel PX (see FIG. 1) and has an opening OP that exposes the first electrode 110. The pixel defining layer 120 may be formed, for example, by depositing an insulating material on the whole surface of the substrate 105 to cover the first electrode 110 using a deposition method and patterning the deposited insulating material.

The pixel defining layer 120 may include an insulating material that causes a contact angle of a first charge transport layer solution 150a (see FIG. 20) relative to the pixel defining layer 120 to be different from a contact angle of the first charge transport layer solution 150a (see FIG. 4) relative to a surface processing layer 140 (see FIG. 19) when a first charge transport layer 150 is formed using an inkjet print method or nozzle print method. For example, the pixel defining layer 120 may include an insulating material that causes the contact angle of the first charge transport layer solution 150a (see FIG. 20) relative to the pixel defining layer 120 to be 40 degrees or more Referring to FIG. 18, a first charge injection layer 130 is formed on the first electrode 110. The first charge injection layer 130 may be formed not only on the first electrode 110 but also on the whole surface of the pixel defining layer 120 using, e.g., slit coating.

Figure 19:
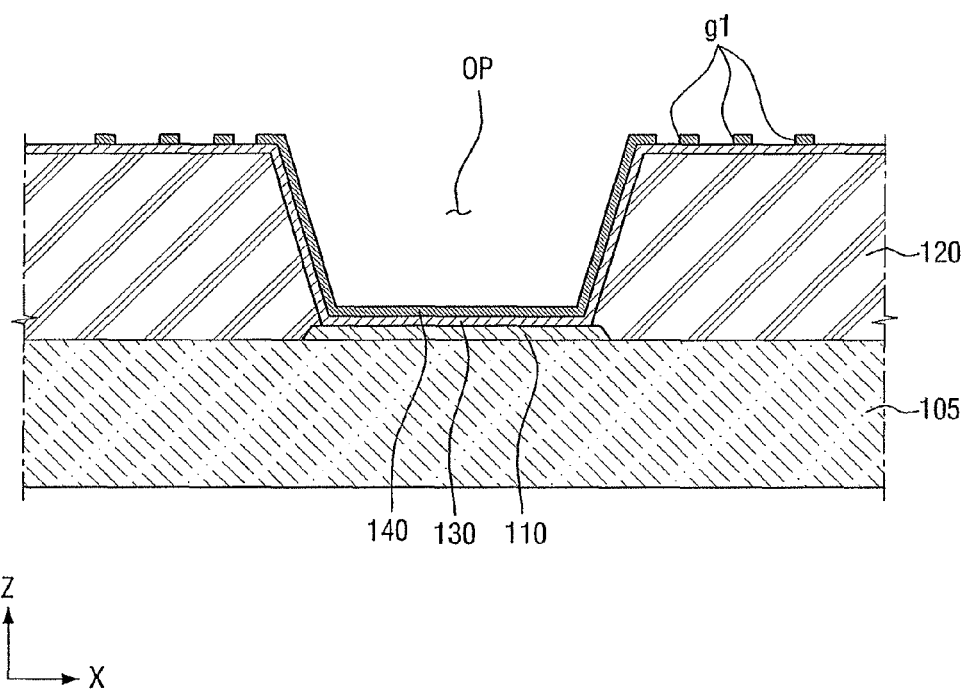

Referring to FIG. 19, the surface processing layer 140 is formed on the first charge injection layer 130, to extend from inside the opening OP of the pixel defining layer 120 to a top surface of the pixel defining layer 120. The surface processing layer 140 may have a plurality of grooves g1 in a portion extending on the top surface of the pixel defining layer 120. The surface processing layer 140 may be formed, for example, by a photolithography process. The surface processing layer 140 may be shaped as illustrated in FIG. 3. The grooves g1 of the surface processing layer 140 may also be formed as the grooves g2 through g8 as in the embodiments of FIGS. 6 through 13.

The surface processing layer 140 may include a conductive primer that causes the surface processing layer 140 to be more lyophilic to the first charge transport layer solution 150a (see FIG. 20) than the pixel defining layer 120, e.g., causes the contact angle of the first charge transport layer solution 150a (see FIG. 20) relative to the surface processing layer 140 to be smaller than the contact angle of the first charge transport layer solution 150a (see FIG. 20) relative to the pixel defining layer 120. In one embodiment, the surface processing layer 140 may include a conductive primer that causes the contact angle of the first charge transport layer solution 150a (see FIG. 20) relative to the surface processing layer 140 to be 20 degrees or less.

Thus, when the first charge transport layer solution 150a (see FIG. 20) is ejected onto the surface processing layer 140 inside the opening OP of the pixel defining layer 120 in each pixel PX using an inkjet print method or nozzle print method, the first charge transport layer solution 150a (see FIG. 20) may be stably confined within the corresponding pixel PX, without spreading to the exposed top surface of the pixel defining layer 120 due to high wettability of the first charge transport layer solution 150a (see FIG. 20) relative to the surface processing layer 140. The first charge transport layer 150 (see FIG. 21) may be uniformly formed on the surface processing layer 140.

Figure 20:
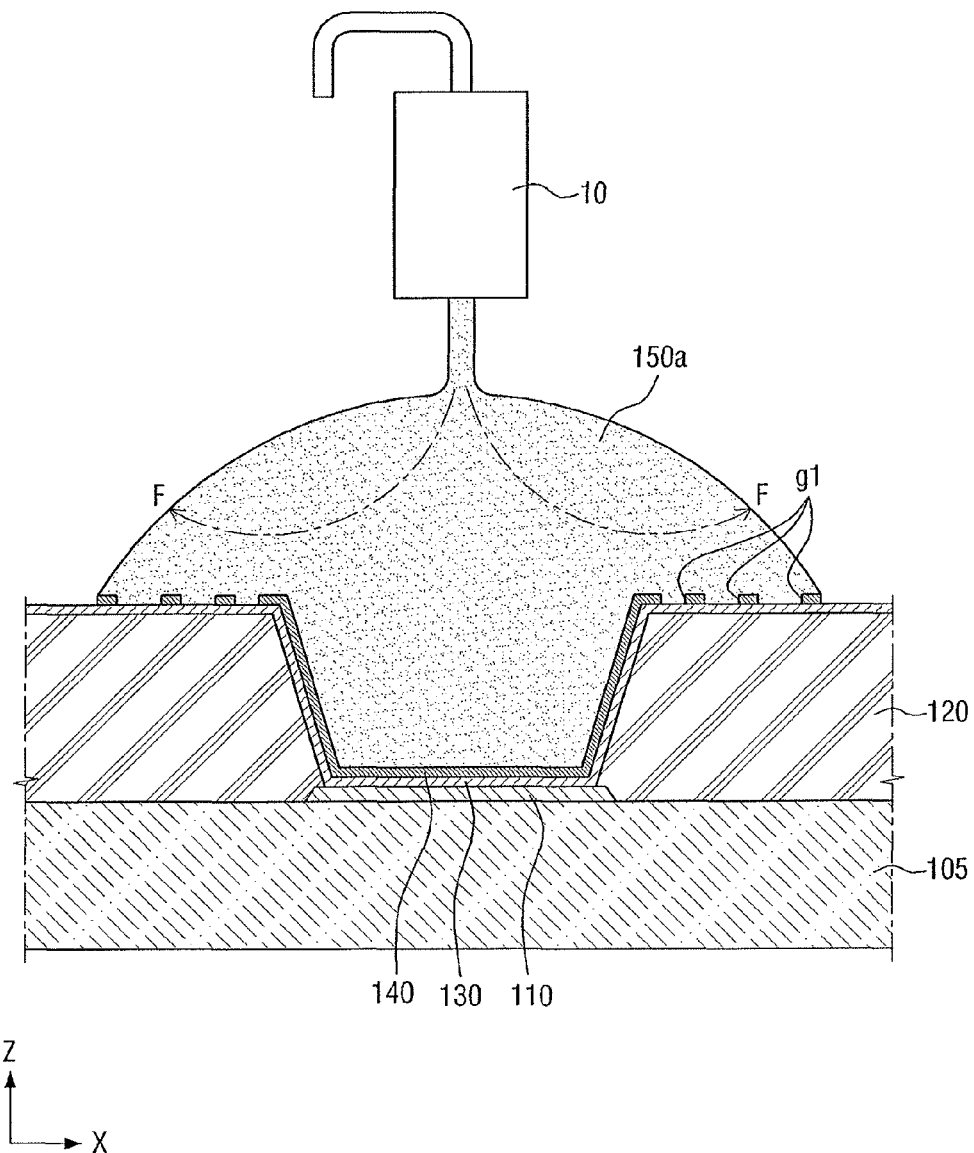
Figure 21:
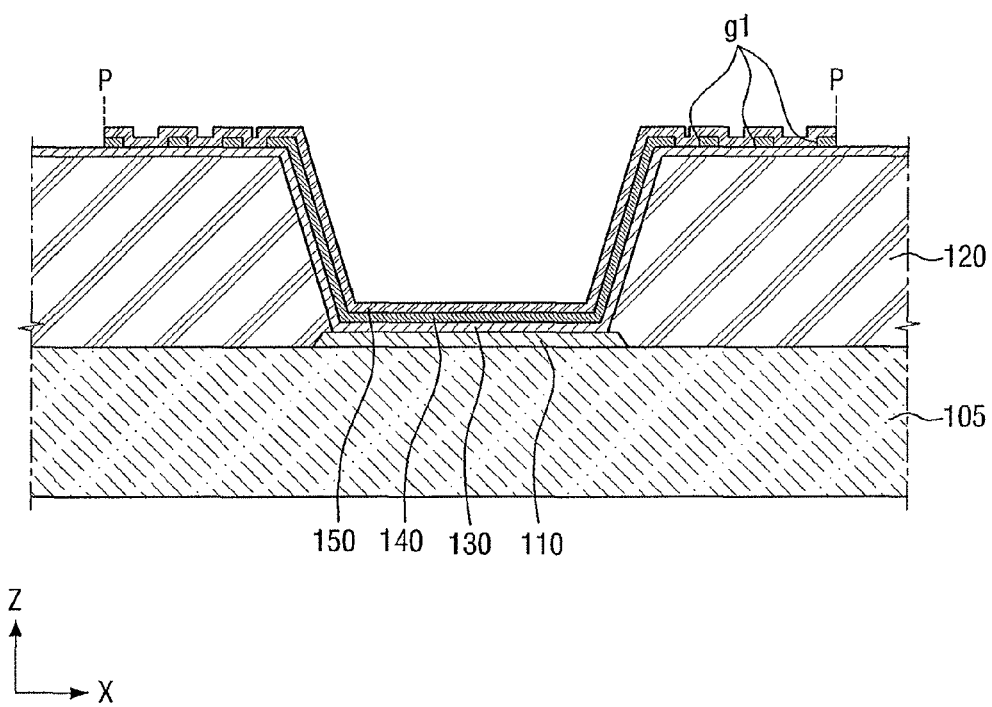

Referring to FIGS. 20 and 21, the first charge transport layer 150 is formed on the surface processing layer 140. For example, referring to FIG. 20, the first charge transport layer solution 150a is ejected from an ejection device 10 into the opening OP of the pixel defining layer 120 using an inkjet print method or nozzle print method. Here, the ejection pressure and ejection speed of the ejection device 10 may generate a large force F with which the first charge transport layer solution 150a spreads beyond the surface processing layer 140. As a result, the first charge transport layer solution 150a may spread from an edge of the surface processing layer 140.

However, the grooves g1 that form roughness at the edge of the surface processing layer 140 may increase resistance to the force F. The increased resistance may prevent the first charge transport layer solution 150a from spreading beyond the surface processing layer 140, thus confining the first charge transport layer solution 150a in the grooves g1.

Referring to FIG. 21, the first charge transport layer solution 150a is dried to form the first charge transport layer 150, which forms pinning points P with the surface processing layer 140, on the surface processing layer 140. The first charge transport layer 150 may be conformally formed along the surface processing layer 140 having the grooves g1.

Figure 22:
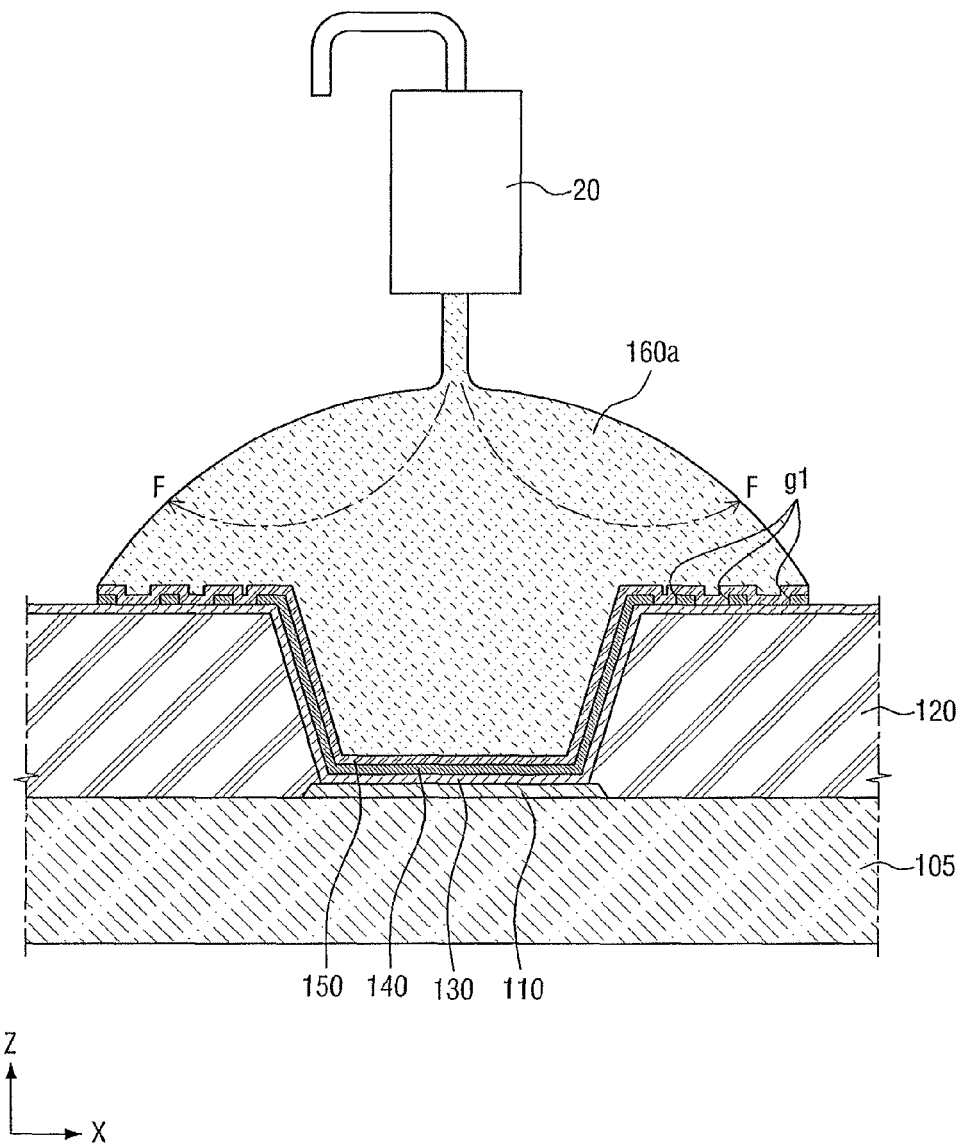
Figure 23:
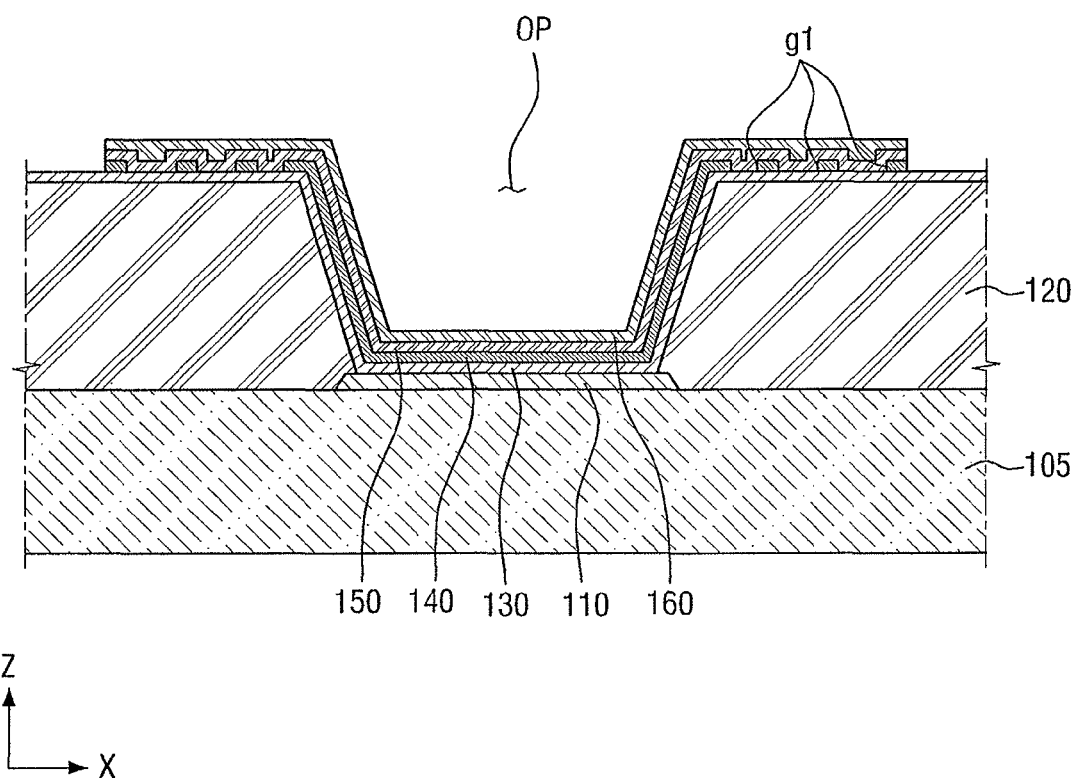

Referring to FIGS. 22 and 23, a light-emitting layer 160 is formed on the first charge transport layer 150. For example, referring to FIG. 22, a light-emitting layer solution 160a is ejected from an ejection device 20 into the opening OP of the pixel defining layer 120 using an inkjet print method or nozzle print method. Here, the light-emitting layer solution 160a may contain the same solvent as the first charge transport layer solution 150a of FIG. 20. In this case, the first charge transport layer 150 may become lyophilic to the light-emitting layer solution 160a, and the light-emitting layer solution 160a, when ejected onto the first charge transport layer 150, may be prevented from spreading beyond the first charge transport layer 150 to the exposed top surface of the pixel defining layer 120.

Referring to FIG. 23, the light-emitting layer solution 160a is dried to form the light-emitting layer 160 on the first charge transport layer 150.

Figure 24:
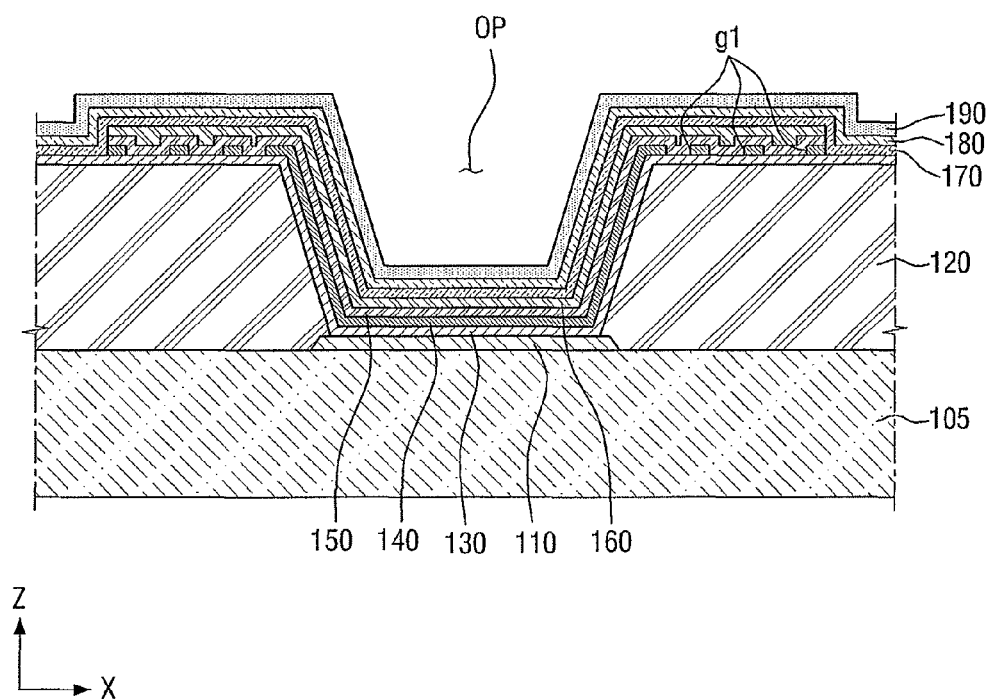

Referring to FIG. 24, a second transport layer 170, a second charge injection layer 180, and a second electrode 190 are formed on the light-emitting layer 160. The second charge transport layer 170, the second charge injection layer 180 and the second electrode 190 may be formed, for example, by a deposition process.

The method of manufacturing a light-emitting display device according to the current embodiment may further include placing an encapsulation substrate on the second electrode 190. In addition, the method of manufacturing a light-emitting display device according to the current embodiment may include placing a spacer between the second electrode 190 and the encapsulation substrate. Various methods may be used for placing the encapsulation substrate and the spacer.

Embodiments of the present invention provide at least one of the following advantages. A light-emitting display device according to one embodiment includes a surface processing layer having roughness formed on an edge thereof by a plurality of grooves. The surface processing layer having roughness may prevent a first charge transport layer solution ejected onto the surface processing layer using an inkjet print method or a nozzle print method from spreading beyond the surface processing layer. Accordingly, this may prevent the first charge transport layer solution from spreading toward an adjacent pixel which emits light of a different color and thus unwantedly forming a first charge transport layer up to part of the adjacent pixel.

Therefore, the light-emitting display device according to at least one embodiment may prevent a light-emitting layer from being formed on the first charge transport layer up to part of the adjacent pixel, thereby avoiding a situation where light-emitting layers emitting light of different colors overlap each other in adjacent pixels. As a result, this can prevent degradation of display quality due to the display of an unwanted mixed color on the light-emitting display device being driven.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A light-emitting display device, comprising:
    a substrate including a plurality of pixels;
    a first electrode on the substrate for each pixel;
    a pixel defining layer on the substrate to define each pixel, the pixel defining layer having an opening to expose the first electrode;
    a surface processing layer including a first portion on the first electrode and a second portion on the pixel defining layer, the surface processing layer including a plurality of grooves on the second portion and the grooves not overlapping with the opening;
    a light-emitting layer on the surface processing layer; and
    a second electrode on the light-emitting layer.

2. The device as claimed in claim 1, wherein the first portion is connected to the second portion.

3. The device as claimed in claim 1, wherein:
    the grooves are on at least one side of the opening along a first direction, and
    the first direction is toward an adjacent pixel which emits light of a different color from a color of light emitted from a pixel in which the surface processing layer is formed.

4. The device as claimed in claim 3, wherein the grooves are shaped substantially as straight lines that extend along a second direction crossing the first direction.

5. The device as claimed in claim 3, wherein the grooves have widths that increase in a direction toward the adjacent pixel.

6. The device as claimed in claim 3, wherein the grooves have substantially equal widths.

7. The device as claimed in claim 3, wherein the grooves have an oblique shape between the first direction and a second direction crossing the first direction.

8. The device as claimed in claim 3, wherein the grooves have a lattice shape.

9. The device as claimed in claim 3, wherein:
the pixels include pixels arranged in a row and that emit light of a same color, and
the surface processing layer is formed in units of the pixels.

10. The device as claimed in claim 1, further comprising:
a charge injection layer between the first electrode and the surface processing layer; and
a charge transport layer between the surface processing layer and the light-emitting layer.

11. The device as claimed in claim 10, wherein the charge transport layer is conformally formed along the surface processing layer.

12. The device as claimed in claim 10, at least a portion of the charge transport layer is filled in the grooves.

13. The device as claimed in claim 1, wherein the light-emitting layer is interposed between the surface processing layer and the second electrode.

* * * * *